US010266236B2

(12) United States Patent
Yamashita

(10) Patent No.: US 10,266,236 B2
(45) Date of Patent: Apr. 23, 2019

(54) FLOAT DEVICE AND SOLAR CELL APPARATUS FOR USE ON WATER

(71) Applicant: KYOCERA CORPORATION, Kyoto (JP)

(72) Inventor: Mitsuo Yamashita, Higashiomi (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/684,844

(22) Filed: Aug. 23, 2017

(65) Prior Publication Data
US 2017/0349245 A1 Dec. 7, 2017

Related U.S. Application Data

(63) Continuation of application No. PCT/JP2016/055667, filed on Feb. 25, 2016.

(30) Foreign Application Priority Data

Feb. 27, 2015 (JP) .................. 2015-037639
Mar. 30, 2015 (JP) .................. 2015-068943

(51) Int. Cl.
*B63B 35/44* (2006.01)
*B63B 35/38* (2006.01)
(Continued)

(52) U.S. Cl.
CPC .............. *B63B 35/44* (2013.01); *B63B 35/00* (2013.01); *B63B 35/38* (2013.01); *F24S 20/70* (2018.05);
(Continued)

(58) Field of Classification Search
CPC ......... B63B 35/00; B63B 35/38; B63B 35/44; B63B 35/73; B63B 3/08
(Continued)

(56) References Cited

U.S. PATENT DOCUMENTS 8,176,868 B2 * 5/2012 Han ....................... B63B 35/38
114/267
2013/0146127 A1 6/2013 Lunoe

FOREIGN PATENT DOCUMENTS

CN 1986325 A 6/2007
JP 2007-109769 A 4/2007
(Continued)

OTHER PUBLICATIONS

International Search Report and Written Opinion dated May 17, 2016, in corresponding International Application No. PCT/JP2016/055667 with Statement of Relevance of Non-English References.

*Primary Examiner* — Lars A Olson
(74) *Attorney, Agent, or Firm* — Duane Morris LLP

(57) ABSTRACT

A floating body includes a main body having first and second surfaces opposite to each other and a first side surface connecting the first and second surfaces and first and second joining parts located on the first side surface to be opposite to each other in a first direction parallel to a ridge line defined by the first surface and the first side surface. The first and second joining parts each include a first portion located on the first side surface and a second portion connected to the first portion to face the first side surface. End portions of the first and second joining parts face each other. A minimum distance between the end portions is greater than twice a width of the second portion in the first direction, and is smaller than a minimum distance between the first portions of the first and second joining parts.

14 Claims, 21 Drawing Sheets

(51) Int. Cl.
*B63B 35/00* (2006.01)
*H02S 10/40* (2014.01)
*H02S 30/10* (2014.01)
*H02S 20/00* (2014.01)
*F24S 20/70* (2018.01)
*F24S 40/80* (2018.01)
*F24S 25/636* (2018.01)
*H01L 31/0475* (2014.01)
*F24S 25/60* (2018.01)
*F24S 25/00* (2018.01)

(52) U.S. Cl.
CPC ............ *F24S 25/636* (2018.05); *F24S 40/80* (2018.05); *H02S 10/40* (2014.12); *H02S 20/00* (2013.01); *H02S 30/10* (2014.12); *B63B 2035/4453* (2013.01); *F24S 2025/015* (2018.05); *F24S 2025/6007* (2018.05); *F24S 2025/801* (2018.05); *H01L 31/0475* (2014.12); *Y02E 10/47* (2013.01); *Y02E 10/50* (2013.01)

(58) Field of Classification Search
USPC .................................. 114/263, 264, 266, 267
See application file for complete search history.

(56) References Cited

FOREIGN PATENT DOCUMENTS

| | | |
|---|---|---|
| JP | 2010-526727 A | 8/2010 |
| WO | 2008/140422 A1 | 11/2008 |

* cited by examiner

IIIc-IIIc

F I G. 6 A
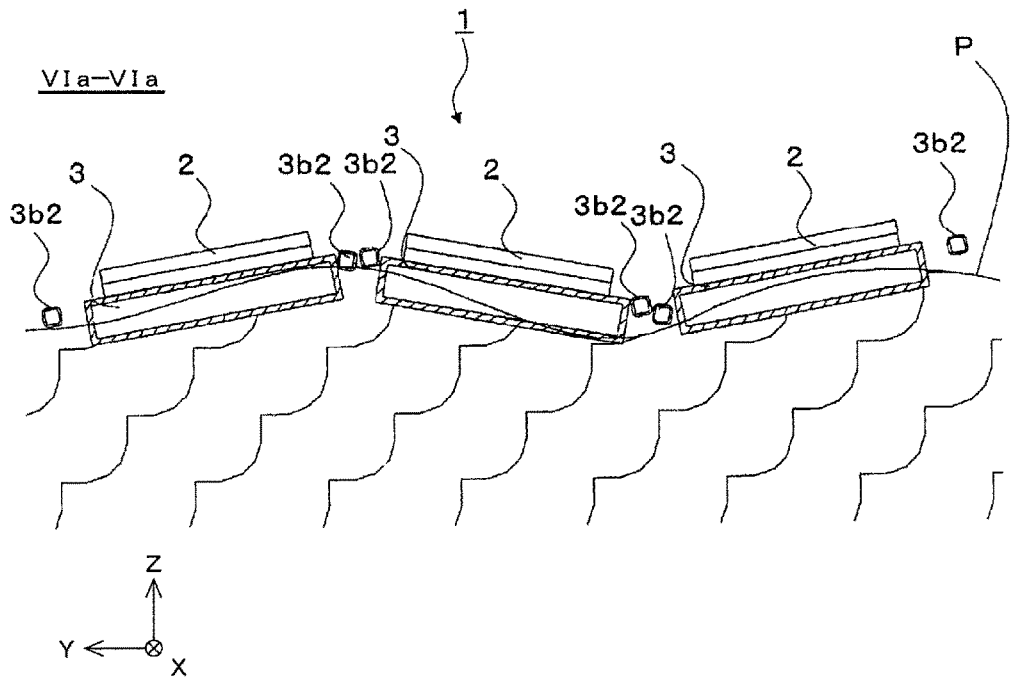
F I G. 6 B
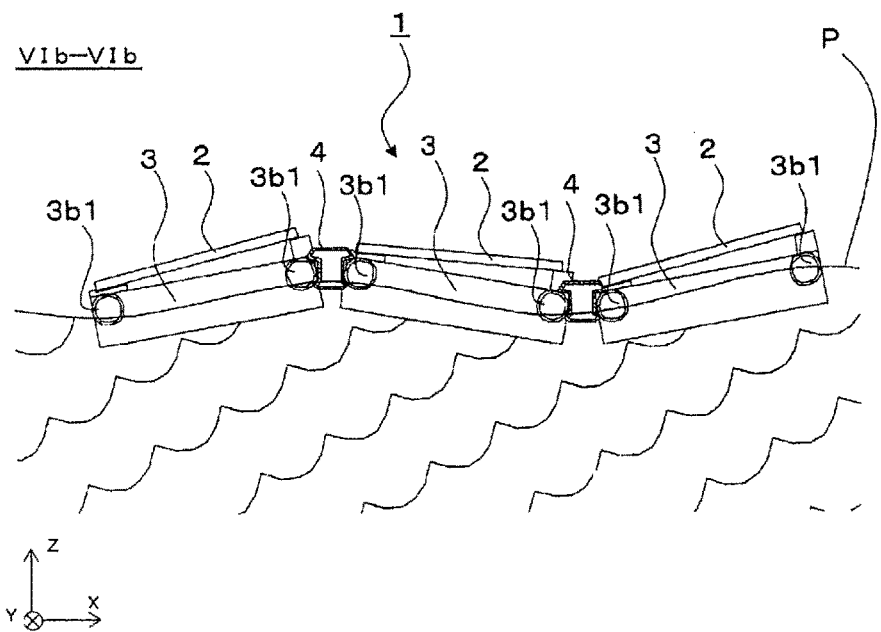

F I G. 2 0
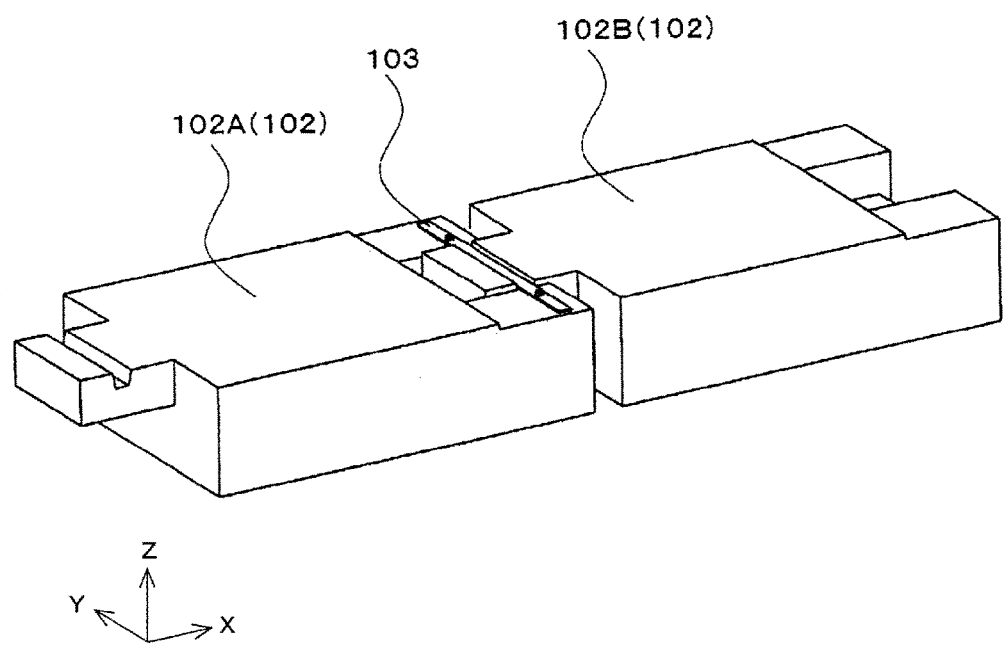

XXIb–XXIb

XXIc–XXIc

FLOAT DEVICE AND SOLAR CELL APPARATUS FOR USE ON WATER

CROSS-REFERENCE TO RELATED APPLICATIONS

The present application is a continuation based on PCT Application No. PCT/JP2016/055667 filed on Feb. 25, 2016, which claims the benefit of Japanese Patent Application No. 2015-037639, filed on Feb. 27, 2015, and Japanese Patent Application No. 2015-068943, filed on Mar. 30, 2015. PCT Application No. PCT/JP2016/055667 is entitled "FLOAT DEVICE AND SOLAR CELL DEVICE USEABLE ON WATER", and both Japanese Patent Application No. 2015-037639 and Japanese Patent Application No. 2015-068943 are entitled "FLOAT DEVICE AND SOLAR CELL APPARATUS FOR USE ON WATER". The contents of which are incorporated by reference herein in their entirety.

FIELD

The present disclosure relates to a float device and a solar cell apparatus for use on water.

BACKGROUND

One type of solar cell apparatuses is a solar cell apparatus for use on water that is installed on water. The solar cell apparatus for use on water includes float devices and solar cell modules attached to the respective float devices.

The solar cell apparatus for use on water includes many float devices joined together on water, and is thus required to be easily installed.

SUMMARY

A float device and a solar cell apparatus for use on water are disclosed. In one embodiment, a float device includes a floating body. The floating body includes a main body part, a first joining part and a second joining part. The main body has a first surface, a second surface opposite the first surface, and a first side surface connecting the first surface and the second surface. The first joining part and the second joining part are located on the first side surface to be opposite to each other in a first direction parallel to a ridge line defined by the first surface and the first side surface. The first joining part and the second joining part each include a first portion located on the first side surface and a second portion connected to the first portion to face the first side surface. The second portion includes an end portion farthest from the first portion. An end portion of the first joining part and an end portion of the second joining part face each other. A minimum distance D1 between the end portion of the first joining part and the end portion of the second joining part is greater than twice a width D2 of the second portion in the first direction, and is smaller than a minimum distance D3 between the first portion of the first joining part and the first portion of the second joining part.

In one embodiment, a solar cell apparatus for use on water includes a plurality of float devices arranged and joined together, and including floating bodies, and solar cell modules mounted on the float devices. The floating bodies each include a main body part, a first joining part and a second joining part. The main body has a first surface on which a corresponding one of the solar cell modules is mounted, a second surface opposite the first surface, and a first side surface connecting the first surface and the second surface. The first joining part and the second joining part are located on the first side surface to be opposite to each other in a first direction parallel to a ridge line defined by the first surface and the first side surface. The first joining part and the second joining part each include a first portion located on the first side surface and a second portion connected to the first portion to face the first side surface. The second portion includes an end portion farthest from the first portion. An end portion of the first joining part and an end portion of the second joining part face each other. A minimum distance D1 between the end portion of the first joining part and the end portion of the second joining part is greater than twice a width D2 of the second portion in the first direction, and is smaller than a minimum distance D3 between the first portion of the first joining part and the first portion of the second joining part.

BRIEF DESCRIPTION OF THE DRAWINGS

FIG. 6A illustrates an end view of the above-mentioned solar cell apparatus for use on water taken along the line VIa-VIa of FIG. 2.

FIG. 6B illustrates an end view of the above-mentioned solar cell apparatus for use on water taken along the line VIb-VIb of FIG. 2.

FIG. 20 illustrates a perspective view of sub-floating bodies according to a second modification of the fifth embodiment.

DESCRIPTION OF EMBODIMENTS

Figure 1A:
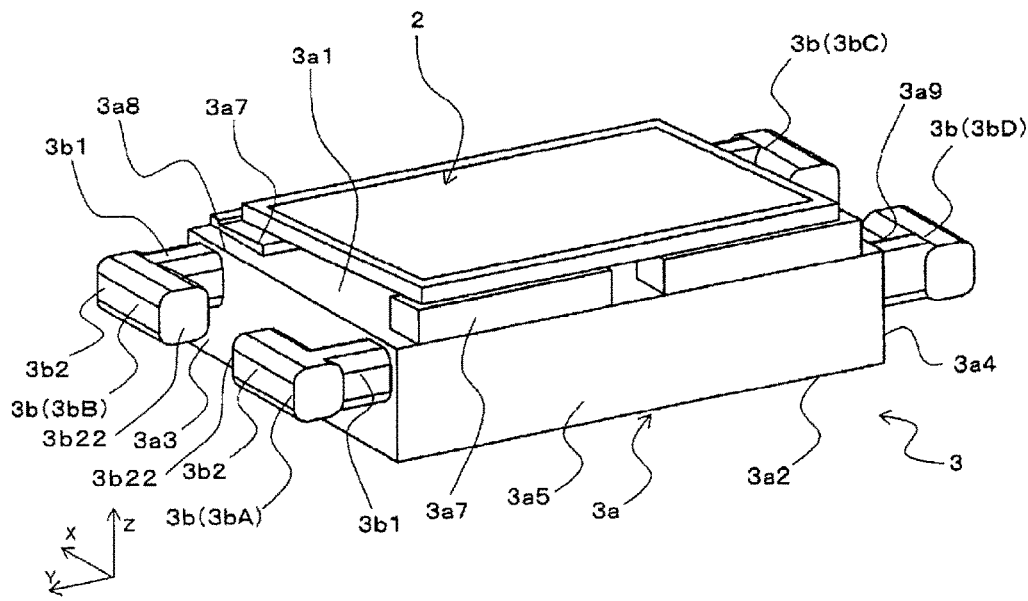
FIG. 1A illustrates a perspective view of a floating body and a solar cell module mounted on the floating body according to a first embodiment.

Embodiments in which Floating Body is Included

First Embodiment

A float device and a solar cell apparatus for use on water according to a first embodiment of the present disclosure will be described in detail below with reference to drawings. Members of the float device and the solar cell apparatus for use on water having the same names bear the same reference signs, and description thereof is not repeated.

A solar cell apparatus for use on water 1 includes a plurality of solar cell modules 2 and floating bodies 3 to which the respective solar cell modules 2 are attached. The float device is not limited to a float device only including floating bodies 3 joined together. The float device includes a float device including sub-floating bodies connected to the floating bodies 3 to provide buoyancy and being usable as pontoons, for example. The float device also includes a float device including members (not illustrated) such as a column member fixed in a hole of the floating body 3, rigging provided between column members of adjacent floating bodies 3, and fittings for fixing the solar cell module 2 to the floating body 3. The float device is hereinafter described as the floating body 3 for convenience sake. The solar cell apparatus for use on water 1 may include a spacer 4 provided between adjacent floating bodies 3 to retain joining of the floating bodies 3. The configuration of the solar cell apparatus for use on water 1 will be described next with reference to FIGS. 1A to 4B.

<Floating Body>

Figure 1B:
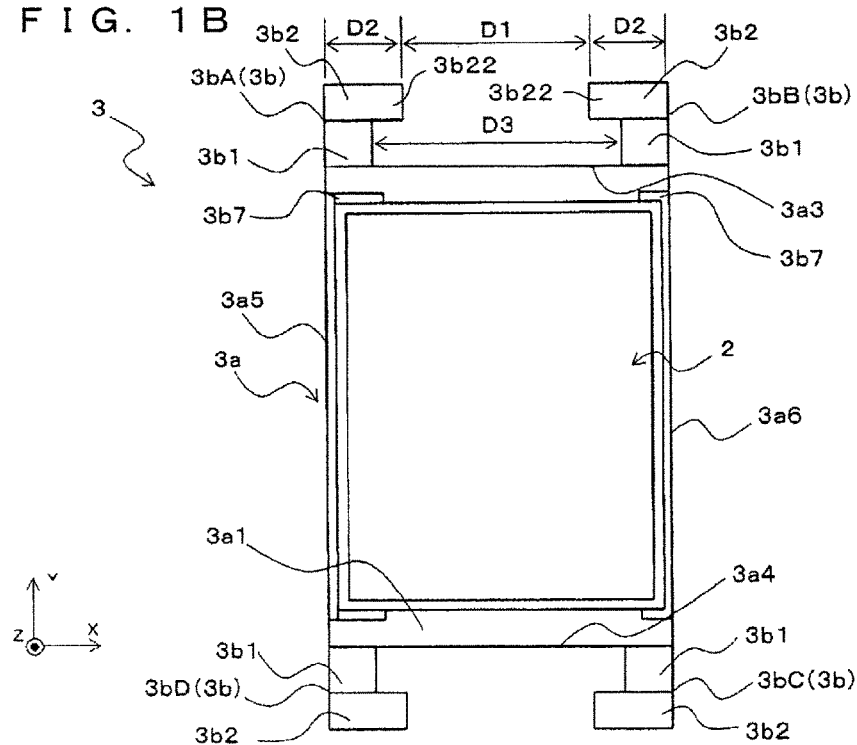
FIG. 1B illustrates a plan view of the floating body and the solar cell module shown in FIG. 1A.
Figure 2:
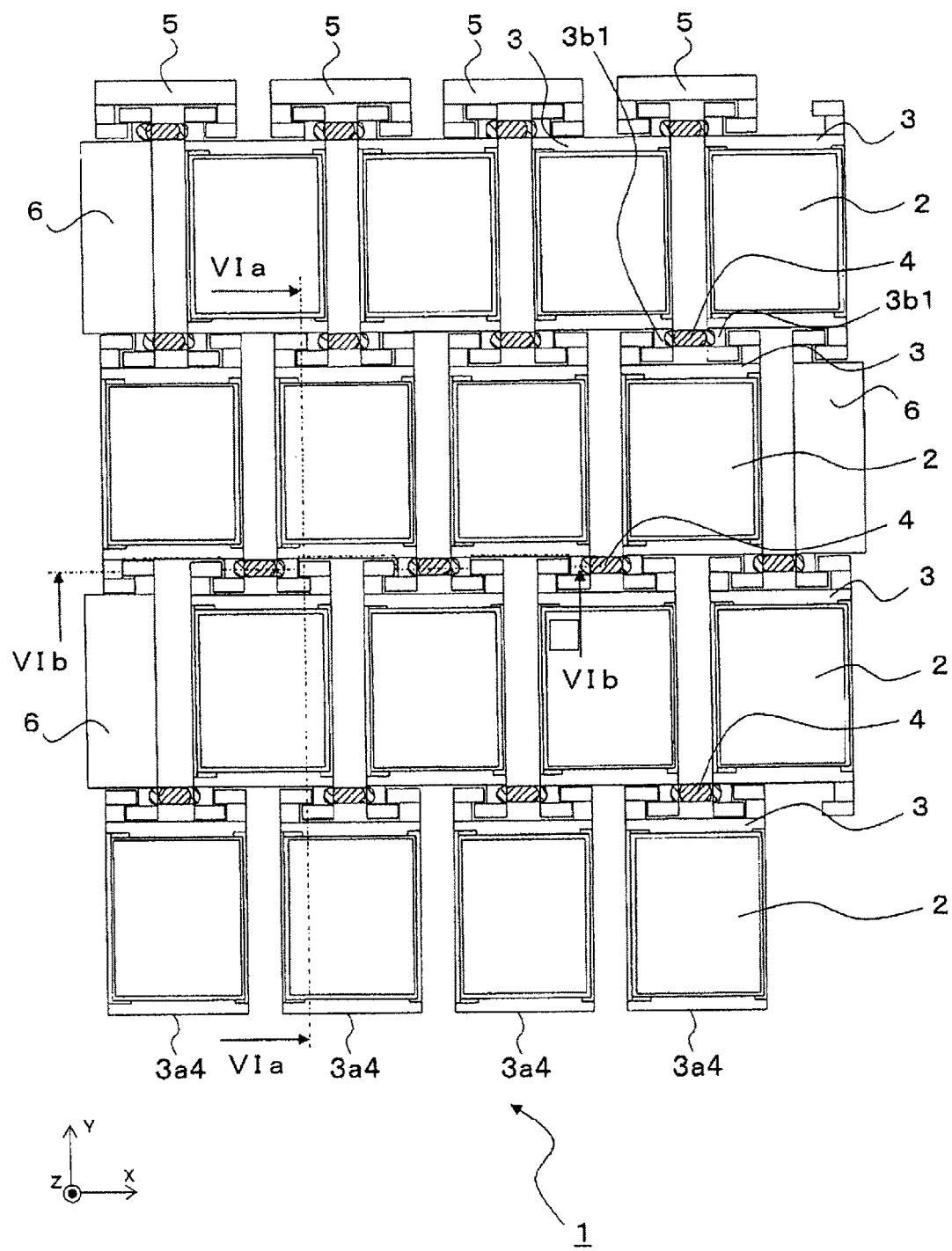
FIG. 2 illustrates a plan view of a solar cell apparatus for use on water according to the first embodiment.

As illustrated in FIGS. 1A, 1B and 2, the floating body 3 includes a main body part $3a$ in the shape of a hollow box and four joining parts $3b$, for example. The floating body 3 has a first surface $3a1$ and a second surface $3a2$ opposite the first surface $3a1$. The floating body 3 also has a first side surface $3a3$ connecting the first surface $3a1$ and the second surface $3a2$, and a second side surface $3a4$ opposite the first side surface $3a3$. The floating body 3 further has a third side surface $3a5$ and a fourth side surface $3a6$ opposite the third side surface $3a5$. The boundary (ridge) between the first surface $3a1$ and the first side surface $3a3$ is hereinafter defined as a first ridge line $3a8$, and the boundary (ridge) between the first surface $3a1$ and the second side surface $3a4$ is hereinafter defined as a second ridge line $3a9$. A direction (hereinafter, also referred to as a first direction) parallel to the first ridge line $3a8$ of the floating body 3 is defined as an X-axis direction, a direction (hereinafter, also referred to as a second direction) perpendicular to the X-axis direction and the first side surface $3a3$ is defined as a Y-axis direction, and a direction orthogonal to the X-axis direction and the Y-axis direction is defined as a Z-axis direction. The solar cell apparatus for use on water 1 is floated on a water surface when being used, and thus the Z-axis direction usually corresponds to a vertical direction. A direction of the Z-axis direction opposite the direction of gravity is referred to as a +Z-axis direction or an upward direction, and a direction of the Z-axis direction identical to the direction of gravity is referred to as a −Z-axis direction or a downward direction.

The first surface $3a1$ is a rectangular surface, for example, and includes a mounting part $3a7$ on which the solar cell module 2 is mounted. The mounting part $3a7$ is provided to protrude upwards from the first surface $3a1$, for example. This enables the solar cell module 2 to be mounted at an angle to the first surface $3a1$. The solar cell module 2 is fixed to the mounting part $3a7$ by a screw and the like.

The floating body 3 includes joining parts $3b$ located on the first side surface $3a3$ to locate on both sides in the X-axis direction. Description will be made below by taking, as an example, a case where the floating body 3 includes a first joining part $3bA$ and a second joining part $3bB$ as a pair of joining parts $3b$. The first joining part $3bA$ and the second joining part $3bB$ each include a first portion $3b1$ located on the first side surface $3a3$. The first joining part $3bA$ and the second joining part 3bB each also include a second portion 3b2 connected to the first portion 3b1 to face the first side surface. Specifically, the second portion 3b2 is located on a head of the first portion 3b1 in a +Y-axis direction, and extends in the X-axis direction.

The second portion 3b2 includes an end portion 3b22 farthest from the first portion 3b1. The end portion 3b22 of the first joining part 3bA and the end portion 3b22 of the second joining part 3bB face each other.

As shown in FIG. 1B, in the floating body 3, the distance between the second portion 3b2 of the first joining part 3bA and the second portion 3b2 of the second joining part 3bB is defined as a first distance D1. The first distance D1 is a minimum distance in the X-axis direction. The width of the second portion 3b2 in the X-axis direction is defined as a second distance D2. The distance between the first portion 3b1 of the first joining part 3bA and the first portion 3b1 of the second joining part 3bB is defined as a third distance D3. In this case, the pair of joining parts 3b is provided so that the first distance D1 is greater than twice the second distance D2, and is smaller than the third distance D3. Joining of the floating bodies 3 is described later.

The first portion 3b1 is in the shape of a prism having a center line parallel to the Y-axis direction, for example. The first portion 3b1 has a curved peripheral surface having rounded corners as viewed from the Y-axis direction. The first portion 3b1 having such configuration allows the solar cell apparatus for use on water 1 to move smoothly about the site of contact between the first portion 3b1 and the spacer 4 when the solar cell apparatus for use on water 1 oscillates due to waves, leading to reduction of cracks of the joining part 3b and the spacer 4.

The second portion 3b2 of the joining part 3b is in the shape of a prism having a center line parallel to the X-axis direction. The second portion 3b2 has a curved peripheral surface having rounded corners as viewed from the X-axis direction. The second portion 3b2 having such configuration allows the solar cell apparatus for use on water 1 to move smoothly about the site of contact between the joining parts 3b of the floating bodies 3 joined together when the solar cell apparatus for use on water 1 oscillates due to waves, leading to reduction of cracks of the joining parts 3b. The peripheral surfaces of the first portion 3b1 and the second portion 3b2 are not limited to the surfaces having rounded corners. For example, the first portion 3b1 and the second portion 3b2 may have chamfered surfaces having chamfered corners.

The floating body 3 may include a pair of joining parts 3b on the second side surface 3a4 as on the first side surface 3a3, for example. In the first embodiment, one of the pair of joining parts 3b on the second side surface 3a4 located on the same axis as the first joining part 3bA in a direction parallel to the Y-axis direction is defined as a fourth joining part 3bD, and the other one of the pair of joining parts 3b on the second side surface 3a4 located on the same axis as the second joining part 3bB in the direction parallel to the Y-axis direction is defined as a third joining part 3bC.

The floating body 3 may have, inside the main body part 3a, a hollow portion isolated from outside air. The capacity of the hollow portion of the floating body 3 is set so that the waterline is located between the first surface 3a1 and the second surface 3a2 when the solar cell apparatus for use on water 1 is floated on a water surface P.

The floating body 3 is formed of polyethylene, polypropylene, fiber reinforced plastics (FRP), or the like, for example. The floating body 3 is formed of such a material by blow molding. The floating body 3 formed of polyethylene has a thickness of approximately 5 mm to 20 mm, for example. The size of the floating body 3 is determined in view of the weight or the size of the solar cell module 2 mounted on the floating body 3. For example, in a case where the solar cell module 2 has a length (a size in the Y-axis direction) of 1.6 m to 1.8 m and a width (a size in the X-axis direction) of 0.9 m to 1.1 m, the floating body 3 may be set to have a length (a size in the Y-axis direction) of approximately 2.1 m to 2.3 m, a width (a size in the X-axis direction) of approximately 1.1 m to 1.3 m, and a height (a size in the Z-axis direction) of approximately 0.2 m to 0.6 m.

The pair of joining parts 3b may not be provided on the surface on which the floating bodies 3 are not joined together as illustrated in FIG. 2.

<Spacer>

Figure 3A:
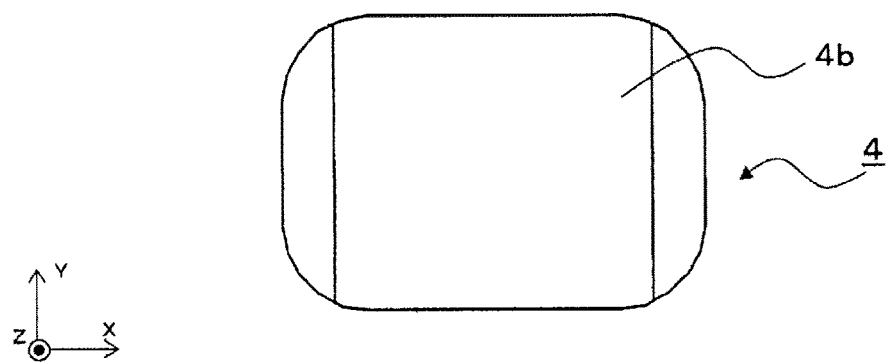
FIG. 3A illustrates a plan view of a spacer used in the solar cell apparatus for use on water according to the first embodiment.
Figure 3B:
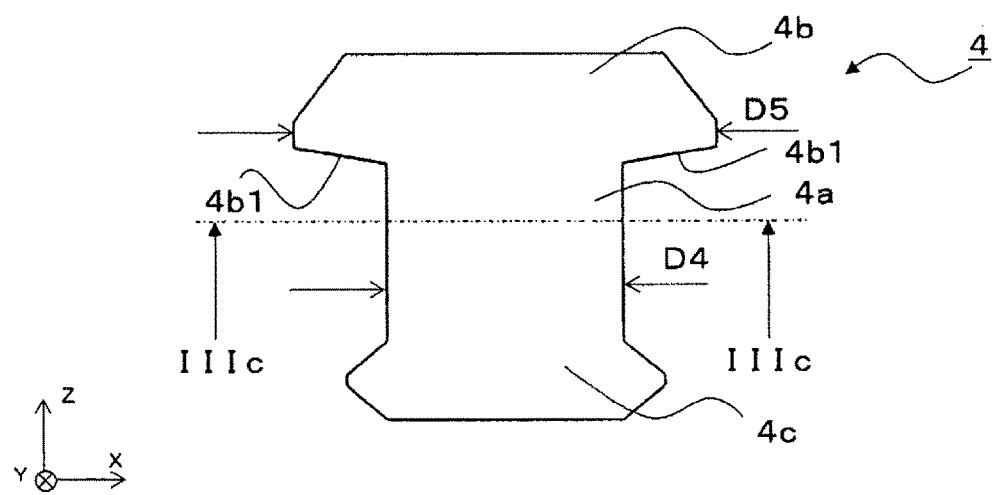
FIG. 3B illustrates an elevation view of the above-mentioned spacer.
Figure 3C:
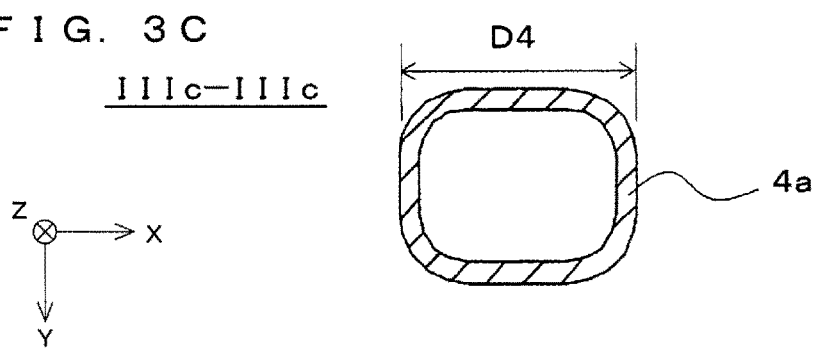
FIG. 3C illustrates an end view of the above-mentioned spacer taken along the line IIIc-IIIc of FIG. 3B.

As illustrated in FIGS. 2 to 3C, the spacers 4 are fitted between floating bodies 3 adjacent to each other in the X-axis direction when a plurality of floating bodies 3 are joined together using pairs of joining parts 3b. With this configuration, the spacers 4 can determine relative positions of the plurality of floating bodies 3 arranged in two dimensions and retain joining of the floating bodies 3. Each of the spacers 4 includes a rectangular shank part 4a and a first protruding part 4b provided at one end of the shank part 4a and having a greater width in the X-axis direction than the shank part 4a. The spacer 4 is a hollow member.

A distance D4 corresponding to the width of the shank part 4a in the X-axis direction has a value greater than a value obtained by subtracting twice the second distance D2 from the first distance D1, and smaller than a value obtained by subtracting twice the second distance D2 from the third distance D3. This makes the floating bodies 3 adjacent to each other in the X-axis direction less likely to be disconnected. A distance D5 corresponding to the width of the first protruding part 4b in the X-axis direction has a value greater than a value obtained by subtracting twice the second distance D2 from the third distance D3 so that the spacer 4 does not sink more than necessary to cause the first protruding part 4b to be fitted between the adjacent floating bodies 3. Each of the distances D1 to D5 indicates a minimum distance. A lower surface 4b1 of the first protruding part 4b, which is located at a shank part 4a side, may slope upwards with respect to the axial direction (Z-axis direction) of the shank part 4a as viewed from the Y-axis direction as illustrated in FIG. 3B. In other words, the shank part 4a and the lower surface 4b1 form an obtuse angle in plan view of the X-Z plane of the spacer 4. The lower surface 4b1 may be a curved surface. This can reduce a load put on the floating bodies 3 and the spacers 4 when waves occur in a place where the solar cell apparatus for use on water 1 is installed.

The spacer 4 may also include a second protruding part 4c provided at the other end of the shank part 4a opposite the end at which the first protruding part 4b is provided and having a greater width in the X-axis direction than the shank part 4a. The second protruding part 4c is caught by a lower portion of the floating body 3 when the spacer 4 is attached to the solar cell apparatus for use on water 1. This means that the second protruding part 4c is located to overlap lower surfaces of the joining parts 3b of the adjacent floating bodies 3. This makes the spacer 4 less likely to be disconnected from between the joining parts 3b of the adjacent floating bodies 3. The width of the second protruding part 4c in the X-axis direction has a value greater than the fourth distance D4 of the shank part 4a, and smaller than a value obtained by subtracting twice the second distance D2 from the third distance D3. This makes the spacer 4 less likely to be disconnected from between the joining parts 3b of the adjacent floating bodies 3 and more likely to be fitted between the joining parts 3b of the adjacent floating bodies 3. The spacer 4 is formed of a similar material and in a similar method to the floating body 3. The spacer 4 formed of polyethylene has a thickness of approximately 5 mm to 20 mm, for example.

<Solar Cell Module>

Figure 4A:
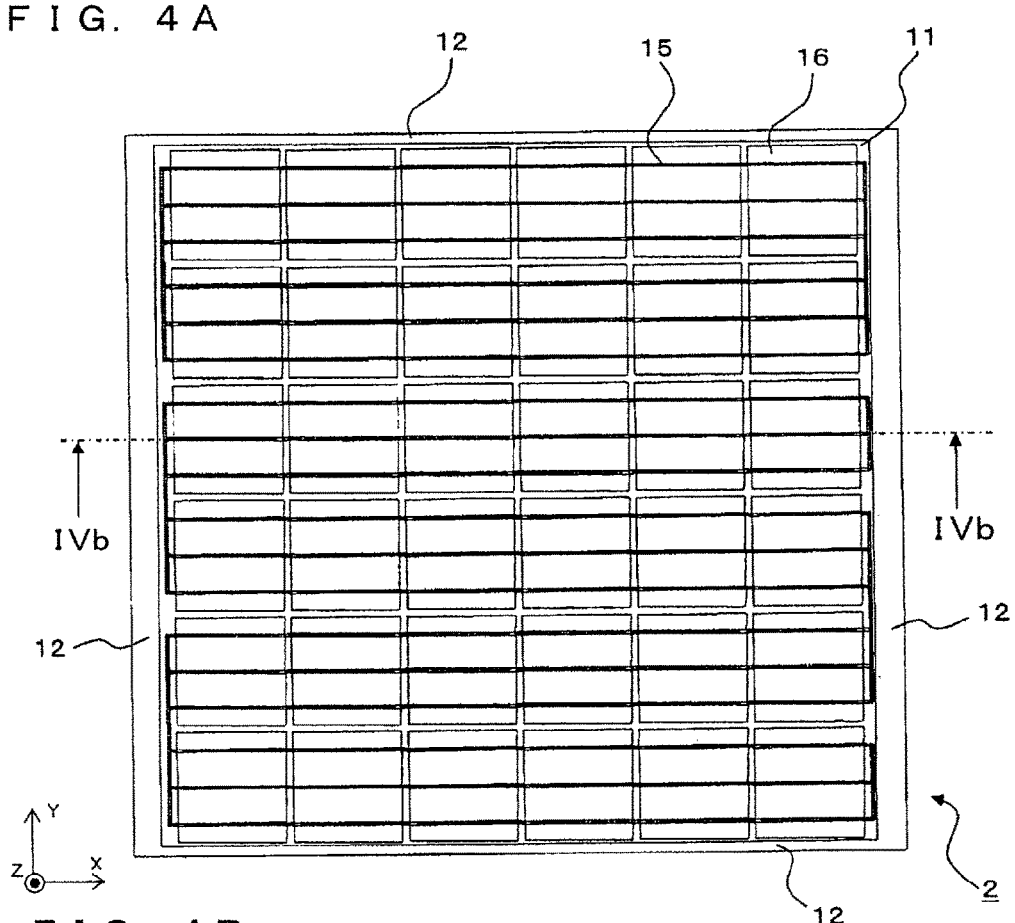
FIG. 4A illustrates a plan view of a solar cell module used in the solar cell apparatus for use on water according to the first embodiment.
Figure 4B:
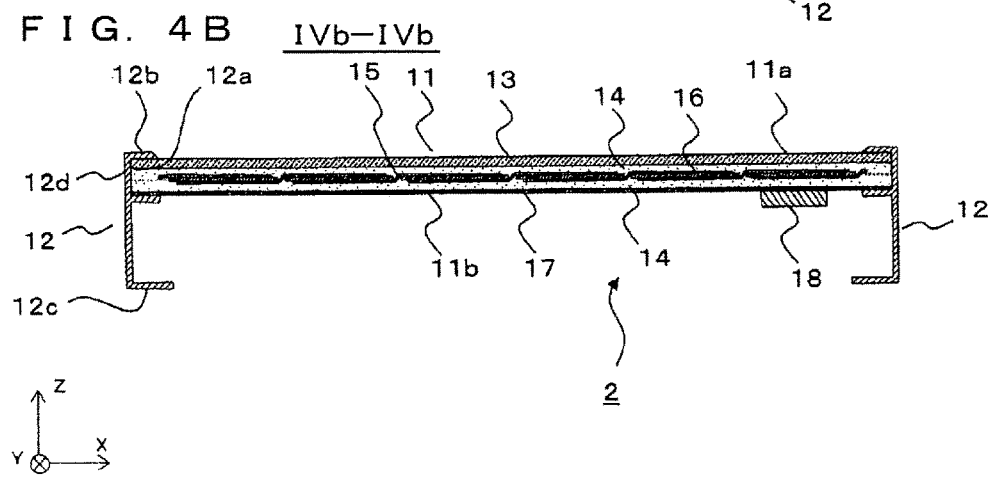
FIG. 4B illustrates an end view of the above-mentioned solar cell module taken along the line IVb-IVb of FIG. 4A.

As illustrated in FIGS. 4A and 4B, the solar cell module 2 includes a solar cell panel 11 and a frame member 12 reinforcing an outer edge portion of the solar cell panel 11.

As illustrated in FIG. 4B, the solar cell panel 11 has a first surface (light receiving surface) 11a (corresponding to one surface of a light-transmissive substrate 13) capable of mainly receiving light and a second surface (non-light receiving surface) 11b (corresponding to one surface of a back-surface protective member 17) opposite the first surface 11a. The solar cell panel 11 includes in sequence, from a first surface 11a side thereof, the light-transmissive substrate 13 doubling as a substrate of the solar cell module 2, a pair of sealing materials 14 formed of thermosetting resin, and a plurality of solar cell devices 16 electrically connected to one another by inner leads 15.

The solar cell panel 11 further includes the back-surface protective member 17 protecting a back surface of the solar cell module 2, and a terminal box 18 for extracting output obtained by the solar cell devices 16 to the outside.

The solar cell panel 11 may receive part of light from a second surface 11b side by forming each of the sealing materials 14 located between the solar cell devices 16 and the back-surface protective member 17 and the back-surface protective member 17 using a light-transmissive material, for example.

The solar cell devices 16 each include a flat substrate formed of monocrystalline silicon, polycrystalline silicon, or the like, for example. In a case where such a silicon substrate is used, adjacent silicon substrates are electrically connected to one another by the inner leads 15 as described above.

The type of solar cell devices 16 is not particularly limited, and another type of solar cell devices 16 may be used. For example, thin-film solar cells formed of amorphous silicon, CIGS solar cells, CdTe solar cells, solar cells including crystalline silicon substrates and amorphous silicon thin films formed on the crystalline silicon substrates, or the like may be used as the solar cell devices 16.

The terminal box 18 includes a box body formed of modified polyphenylene ether resin or polyphenylene oxide resin, a terminal plate located inside the box body, and an output cable deriving power to the outside of the box body, for example.

The frame member 12 has a function of holding the solar cell panel 11. The frame member 12 includes a fitting part 12a into which a peripheral portion of the solar cell panel 11 is inserted. The frame member 12 further includes a frame first surface 12b located at a sunlight receiving side, a frame flange part 12c located opposite the frame first surface 12b, and a frame side wall part 12d connecting the frame first surface 12b and the frame flange part 12c. The frame flange part 12c is a plate-like part protruding from a lower portion of the frame side wall part 12d towards the interior of the solar cell module 2. The frame member 12 having such configuration can be manufactured by extruding aluminum and the like, for example.

A method of joining a plurality of floating bodies 3 of the solar cell apparatus for use on water 1 together will be described next. In the present embodiment, description is made by using a first floating body 3A, a second floating body 3B, and a third floating body 3C as the plurality of floating bodies 3.

Figure 5A:
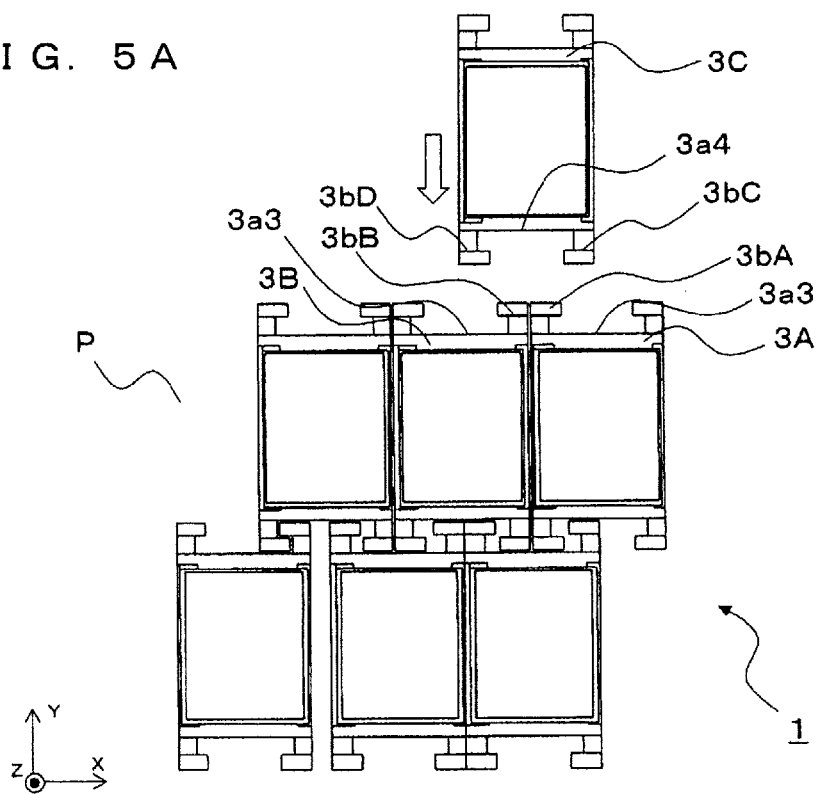
FIG. 5A illustrates a plan view of a plurality of floating bodies of the solar cell apparatus for use on water according to the first embodiment before being joined together.

First, the first floating body 3A and the second floating body 3B are floated on the water surface P to be arranged in the X-axis direction, as illustrated in FIG. 5(a). Next, the first floating body 3A and the second floating body 3B are arranged so that the first joining part 3bA of the first floating body 3A and the second joining part 3bB of the second floating body 3B are in contact with each other. Then, the third floating body 3C is floated on the water surface P so that the second side surface 3a4 of the third floating body 3C faces the first side surface 3a3 of the first floating body 3A and the first side surface 3a3 of the second floating body 3B. Then, the third floating body 3C is moved closer to the first floating body 3A and the second floating body 3B. Then, the third floating body 3C is arranged so that the first joining part 3bA of the first floating body 3A and the second joining part 3bB of the second floating body 3B are located between the third joining part 3bC and the fourth joining part 3bD of the third floating body 3C.

Figure 5B:
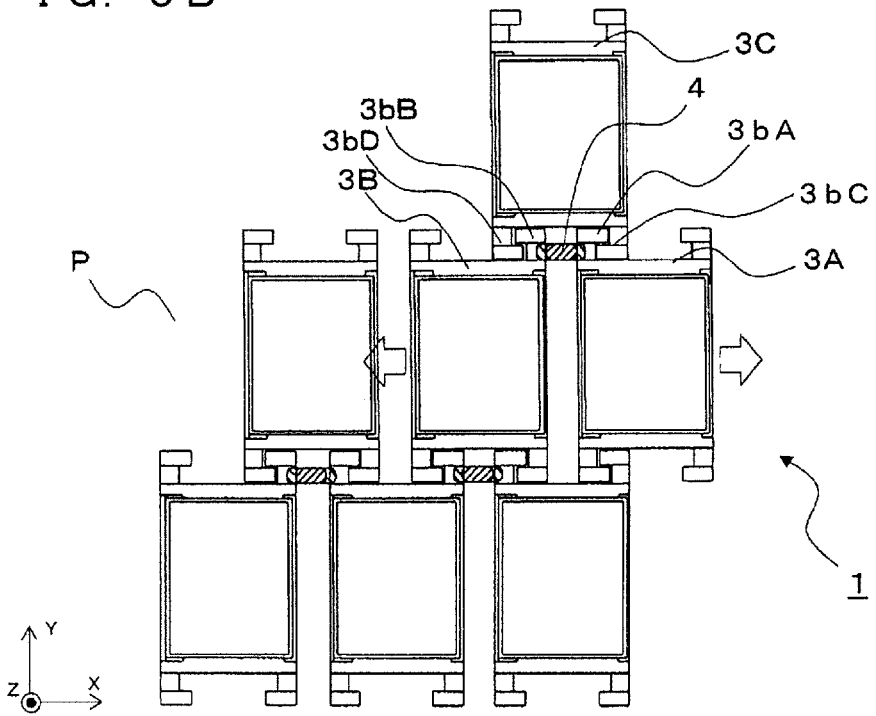
FIG. 5B illustrates a plan view of the above-mentioned plurality of floating bodies after being joined together.
Figure 7A:
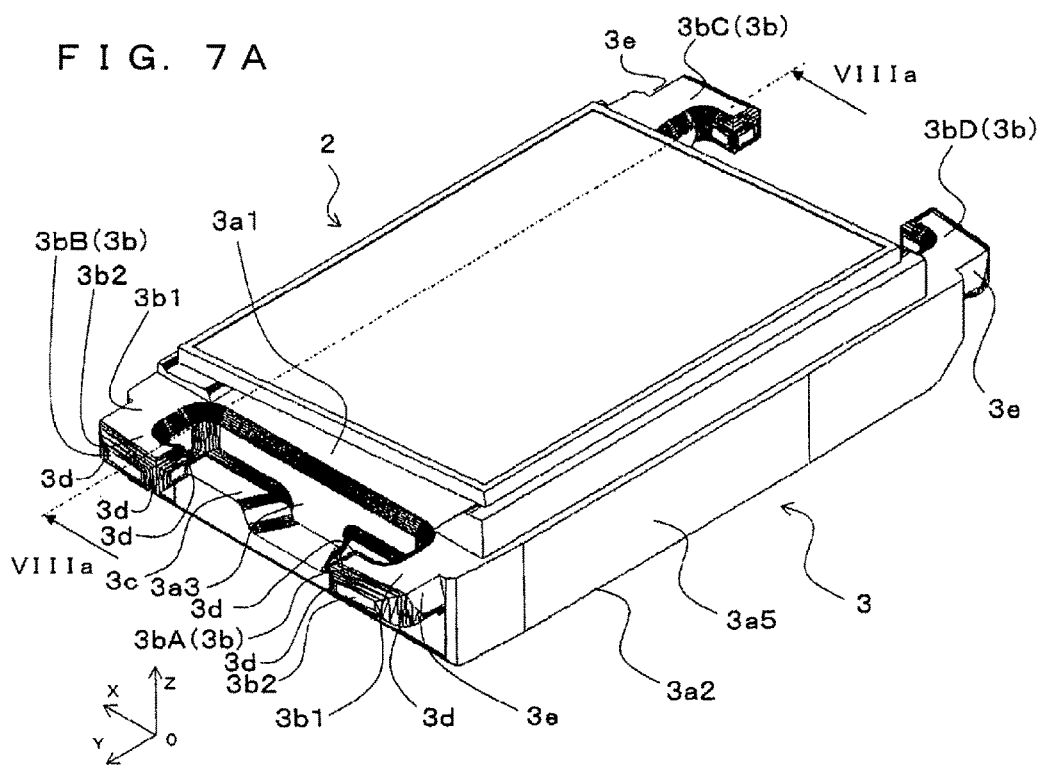
FIG. 7A illustrates a perspective view of a floating body and a solar cell module mounted on the floating body according to a second embodiment.
Figure 7B:
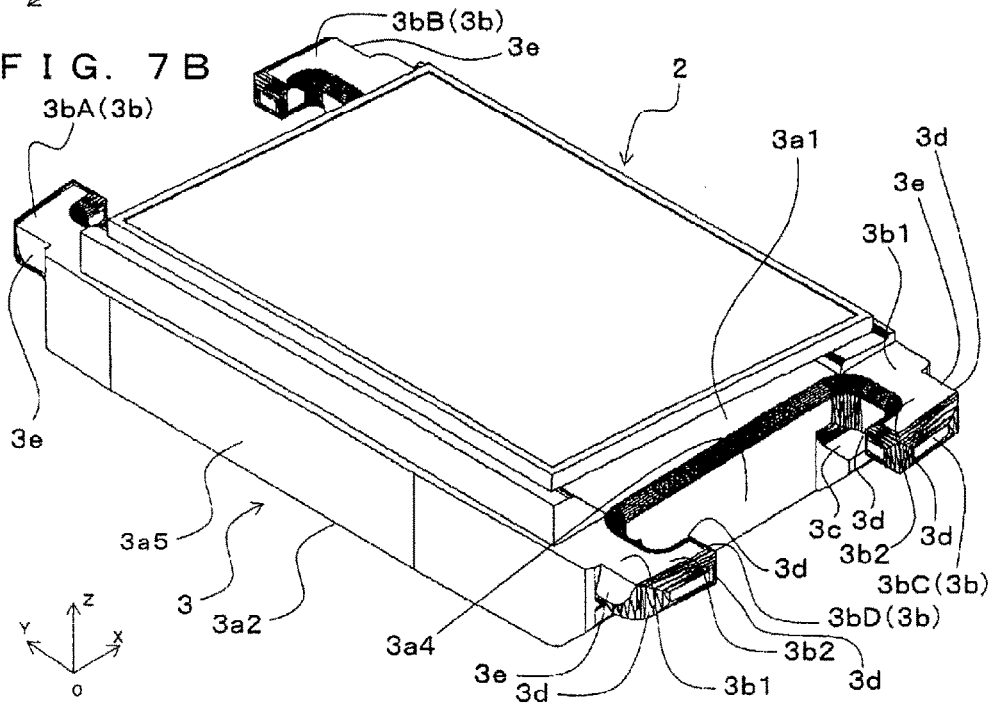
FIG. 7B illustrates a perspective view of the floating body and a solar cell module shown in FIG. 7A as viewed from a different direction.

Next, the first floating body 3A and the second floating body 3B are moved away from each other in a direction parallel to the X-axis direction to cause the first joining part 3bA of the first floating body 3A and the third joining part 3bC of the third floating body 3C to engage with each other, as illustrated in FIG. 5(b). The second joining part 3bB of the second floating body 3B and the fourth joining part 3bD of the third floating body 3C are also caused to engage with each other.

Next, the spacer 4 is fitted between the first floating body 3A and the second floating body 3B. This prevents the distance between the first floating body 3A and the second floating body 3B from being smaller than the width of the shank part 4a of the spacer 4. As a result, the first floating body 3A, the second floating body 3B, and the third floating body 3C are joined together by the joining parts 3b engaging with each other. As described above, the plurality of floating bodies 3 floated on the water surface P are moved along the water surface P to join the floating bodies 3 together in the present embodiment.

With this configuration, an operator can easily join the floating bodies 3 together even if the floating bodies 3 have a large size due to upsizing of the solar cell module 2 in the first embodiment, leading to easier installation. This is particularly useful in the case of providing the solar cell apparatus for use on water 1 including many solar cell modules 2 as in a mega solar power plant.

In the first embodiment, relative positions of a plurality of floating bodies 3 is determined and engagement of the joining parts 3b is retained using the spacer 4 fitted between adjacent floating bodies 3. The positions of the floating bodies 3 can thereby be determined more easily compared to a method of connecting each of the floating bodies 3 to the land and the like using a mooring cable and the like. Ease of installation is thus increased.

A case where the solar cell apparatus for use on water 1 oscillates due to waves and the like is described next. A case where waves occur along the Y-axis direction is described first with reference FIG. 6A. The floating bodies 3 joined together along the X-axis direction can individually oscillate with up-and-down movement of the water surface P when waves occur. As described above, when the second portions 3b2 have rounded or chamfered corners in plan view of a Y-Z plane, the joining parts 3b of the respective floating bodies 3 joined together can move smoothly about the site of contact between the joining parts 3b. This makes the main body parts 3a and the joining parts 3b less likely to bear an excessive load due to oscillation of the floating bodies 3. Cracks of the floating bodies 3 can thereby be reduced.

A case where waves occur along the X-axis direction is described next with reference FIG. 6B. The floating bodies 3 adjacent to each other in the Y-axis direction can individually oscillate with up-and-down movement of the water surface P when waves occur. This similarly makes the floating bodies 3 and the spacers 4 less likely to bear an excessive load, leading to reduction of cracks of the floating bodies 3 and the spacers 4.

The solar cell apparatus for use on water 1 may include a member other than the solar cell modules 2, floating bodies 3, and the spacers 4. For example, the solar cell apparatus for use on water 1 may include first auxiliary floating bodies 5 and second auxiliary floating bodies 6 surrounding the floating bodies 3 joined together, as illustrated in FIG. 2. The first auxiliary floating bodies 5 and the second auxiliary floating bodies 6 are hollow bodies each having a shape corresponding to the shape of only a part of a floating body 3.

Each of the first auxiliary floating bodies 5 engages with the joining parts 3b of two adjacent floating bodies 3 outside a group of floating bodies 3. The adjacent floating bodies 3 are thereby joined together more firmly. The second auxiliary floating bodies 6 can be used as places to put electrical equipment, such as a cable and a junction box, or as scaffolds for operators. As described above, the second auxiliary floating bodies 6 improve ease of installation and maintainability of the solar cell apparatus for use on water 1.

Second Embodiment

The second embodiment differs from the above-mentioned first embodiment in that the floating bodies 3 of the solar cell apparatus for use on water 1 each include a protruding part 3c located on the first side surface 3a3 to be closer to the second surface 3a2 than the pair of joining parts 3b is, as illustrated in FIGS. 7A to 9. Specifically, the protruding part 3c protrudes from a portion of the first side surface 3a3 lower than the joining parts 3b. The protruding part 3c may also be located on the second side surface 3a4.

Figure 8A:
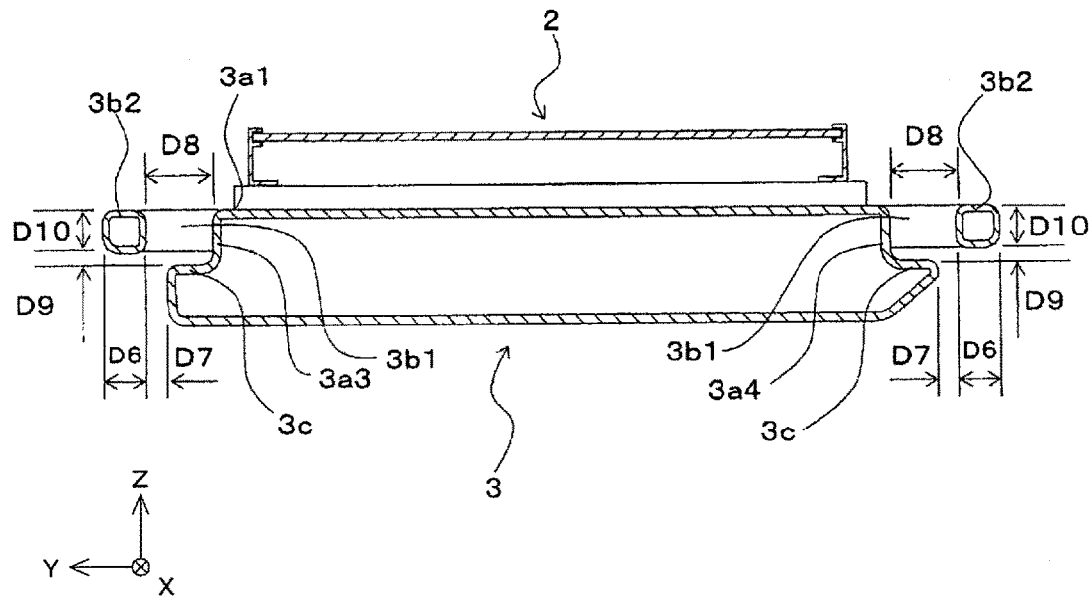
FIG. 8A illustrates a sectional view of the above-mentioned floating body and a solar cell module taken along the line VIIIa-VIIIa of FIG. 7A.

Next, the joining parts 3b and the protruding part 3c have the following relationship: In FIG. 8A, a distance D6 corresponding to the width of the second portion 3b2 in the Y-axis direction is greater than a distance D7 between the second portion 3b2 and the protruding part 3c in the Y-axis direction, and is smaller than a distance D8 corresponding to the length of the first portion 3b1 in the Y-axis direction. A distance D9 corresponding to a gap between the protruding part 3c and the joining part 3b in the Z-axis direction is smaller than a distance D10 corresponding to the width of the joining part 3b in the Z-axis direction, and is greater than zero. Each of the distances D6 to D10 indicates a minimum distance.

Figure 8B:
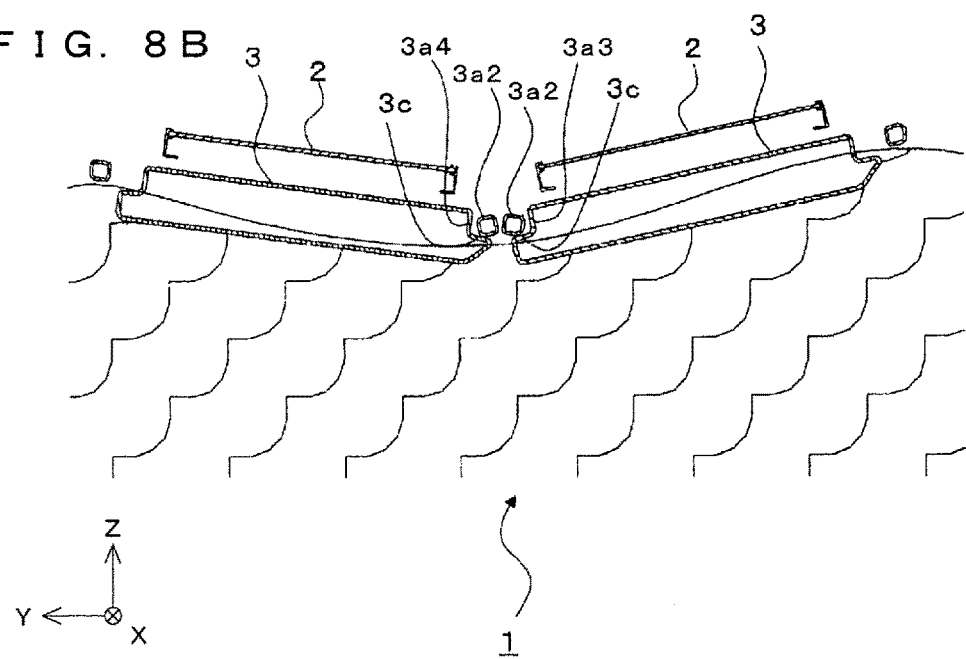
FIG. 8B illustrates an end view of the solar cell apparatus for use on water according to the second embodiment, and corresponds to the end view of the solar cell apparatus for use on water shown in FIG. 6A.

This makes adjacent floating bodies 3 less likely to be disconnected from each other in the vertical direction if the adjacent floating bodies 3 individually oscillate due to waves to increase a difference of altitude between the adjacent floating bodies 3 in the Z-axis direction in the second embodiment, as illustrated in FIG. 8B. Joining of the floating bodies 3 is thereby more likely to be maintained.

Figure 9:
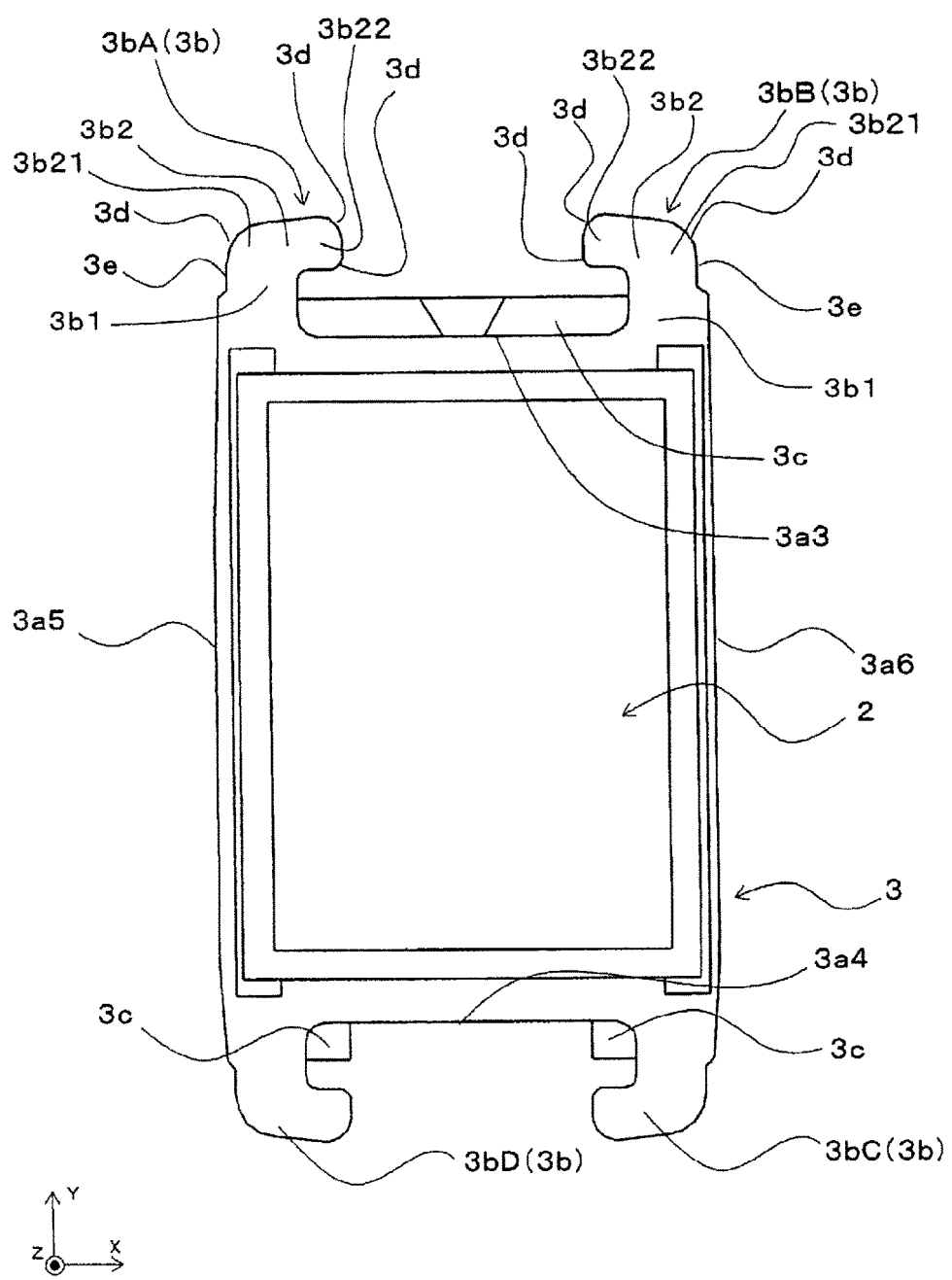
FIG. 9 illustrates a plan view of a floating body of a float device and a solar cell module mounted on the floating body according to a first modification of the second embodiment.
Figure 10:
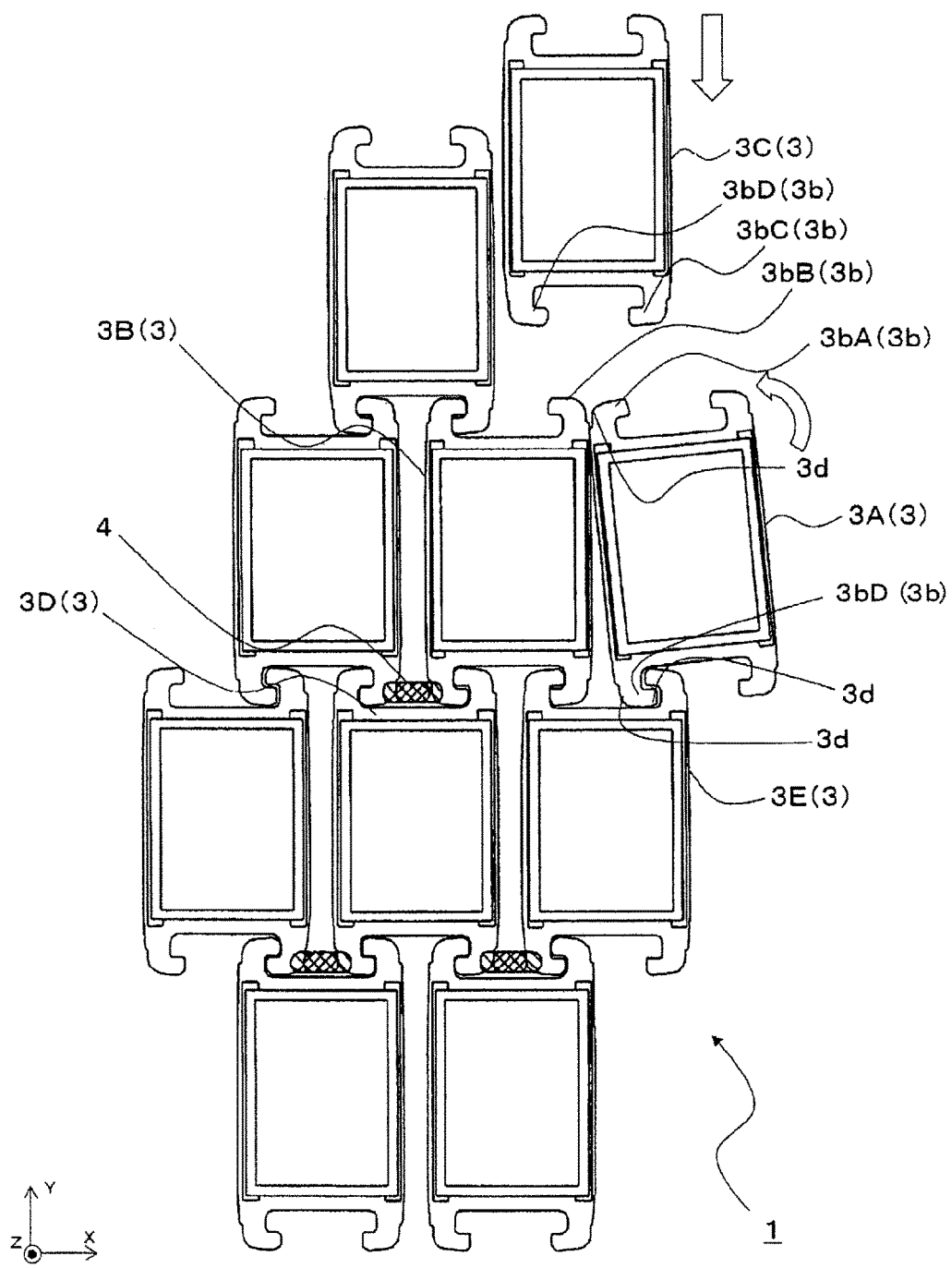
FIG. 10 illustrates a plan view of a solar cell apparatus for use on water according to the first modification of the second embodiment, and corresponds to the plan view of the plurality of floating bodies shown in FIG. 5.

In addition, the second portion 3b2 includes a curved portion 3b21 connected to the head of the first portion 3b1 and an end portion 3b22 located opposite the curved portion 3b21 in plan view from a first surface 3a1 side as illustrated in FIG. 9. In this case, the curved portion 3b21 and the end portion 3b22 may have rounded or chamfered portions 3d at the corners thereof as viewed from the first surface 3a1 side. With such configuration, a new floating body 3 is easily joined to three or more floating bodies 3 joined together and fixed. For example, in a case where the second floating body 3B is joined to a fourth floating body 3D and a fifth floating body 3E as illustrated in FIG. 10, the first floating body 3A is easily rotated towards the second floating body 3B. The first joining part 3bA of the first floating body 3A and the second joining part 3bB of the second floating body 3B are thus easily moved closer to each other. With such configuration, new floating bodies 3 can easily be joined in sequence to three or more floating bodies 3 fixed by the spacers 4. As a result, the solar cell apparatus for use on water 1 having a large scale can more easily be installed. Lines showing the protruding part 3c are omitted in FIG. 10.

The floating body 3 may expand outwards (in the X-axis direction) in the middle of the third side surface 3a5 and the fourth side surface 3a6 as illustrated in FIG. 9. The floating body 3 having such a shape can easily be rotated to move the joining parts 3b of adjacent floating bodies 3 closer to each other as illustrated in FIG. 10. The volume of the floating body 3 increases to thereby increase buoyancy, leading to an increase in stability of the solar cell module 2. The third side surface 3a5 and the fourth side surface 3a6 illustrated in FIG. 9 may be polygonal or arcuate in plan view from the Z-axis direction.

The floating body 3 may have, in the first portions 3b1, dent portions 3e set further back than the third side surface 3a5 and the fourth side surface 3a6 as illustrated in FIGS. 7A to 9. This makes the spacer 4 less likely to be moved from the positions of the dent portions 3e when the spacer 4 is fitted between the first portions 3b1 of the floating bodies 3 adjacent to each other in the X-axis direction. The spacer 4 is thereby less likely to be disconnected from between the first portions 3b1 of the adjacent floating bodies 3. The dent portions 3e may be grooves formed in the first portions 3b1 into which the spacer 4 is fitted, for example.

Figure 11:
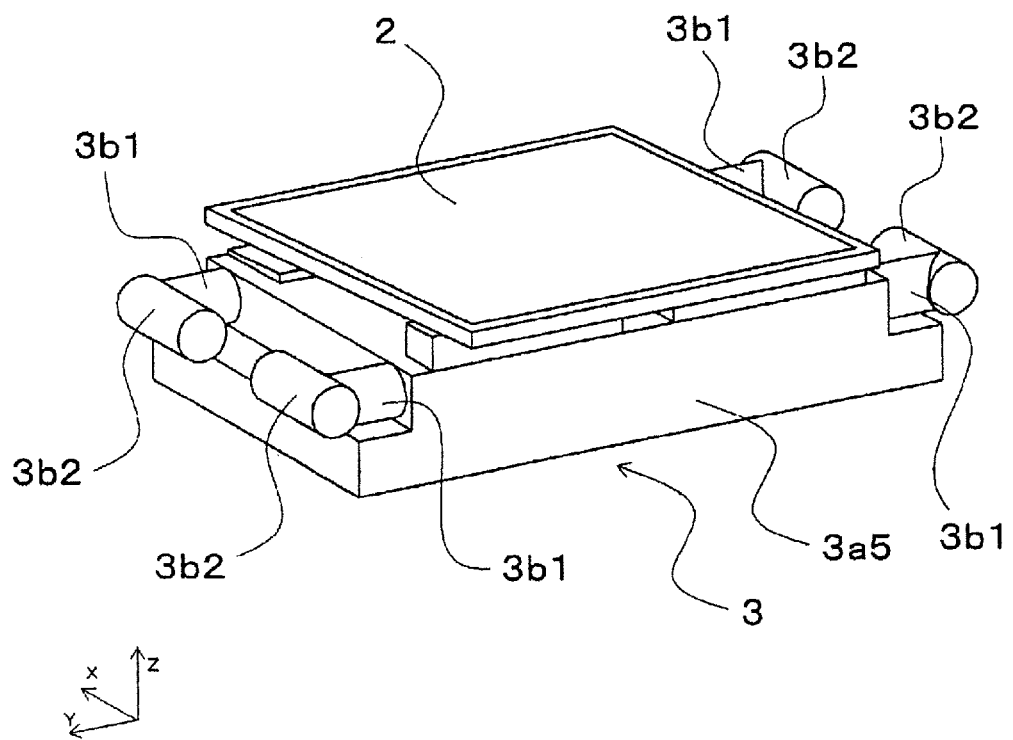
FIG. 11 illustrates a perspective view of a floating body of a float device and a solar cell module mounted on the floating body according to a second modification of the second embodiment.
Figure 12:
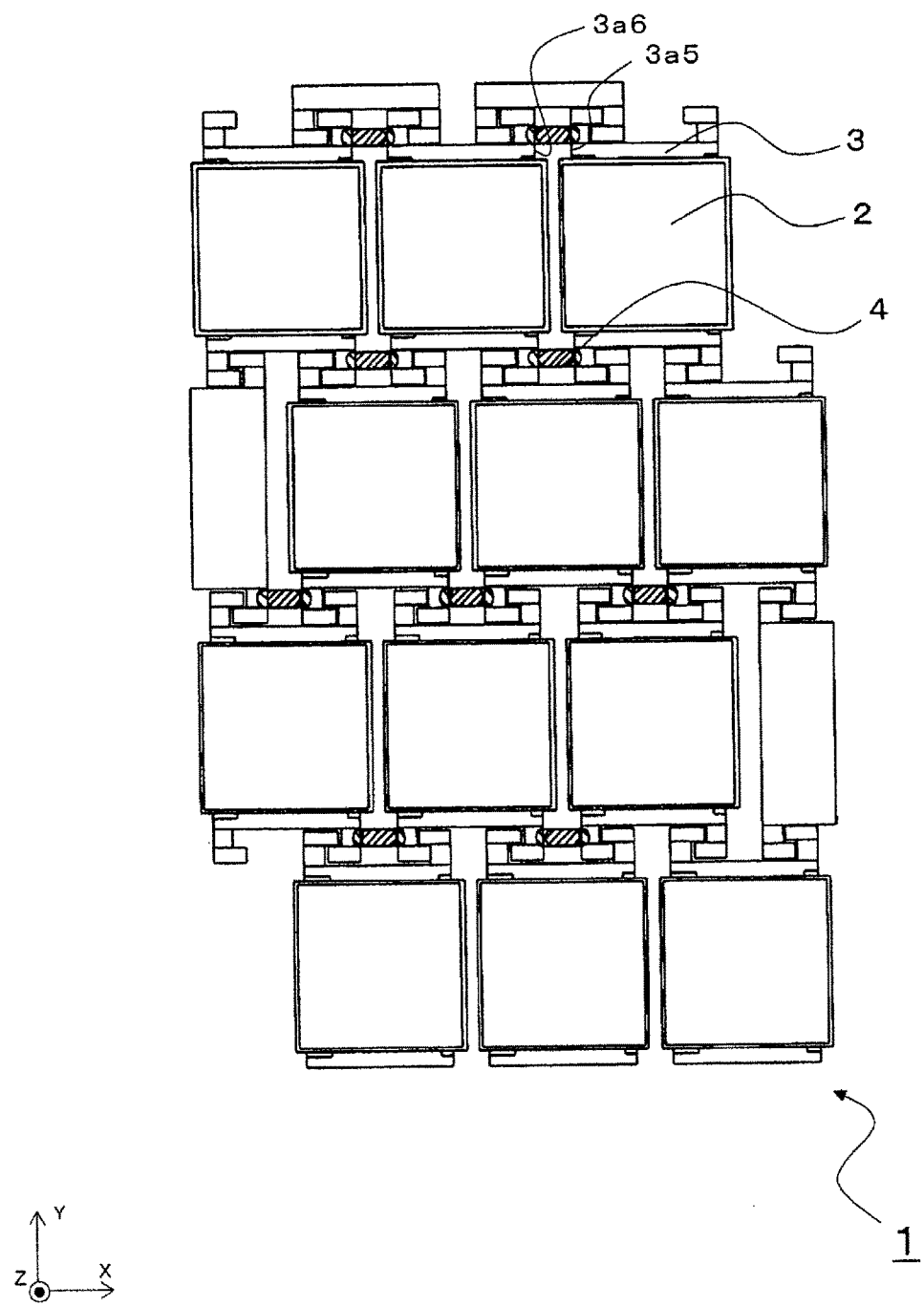
FIG. 12 illustrates a plan view of a solar cell apparatus for use on water according to the second modification of the second embodiment.
Figure 13A:
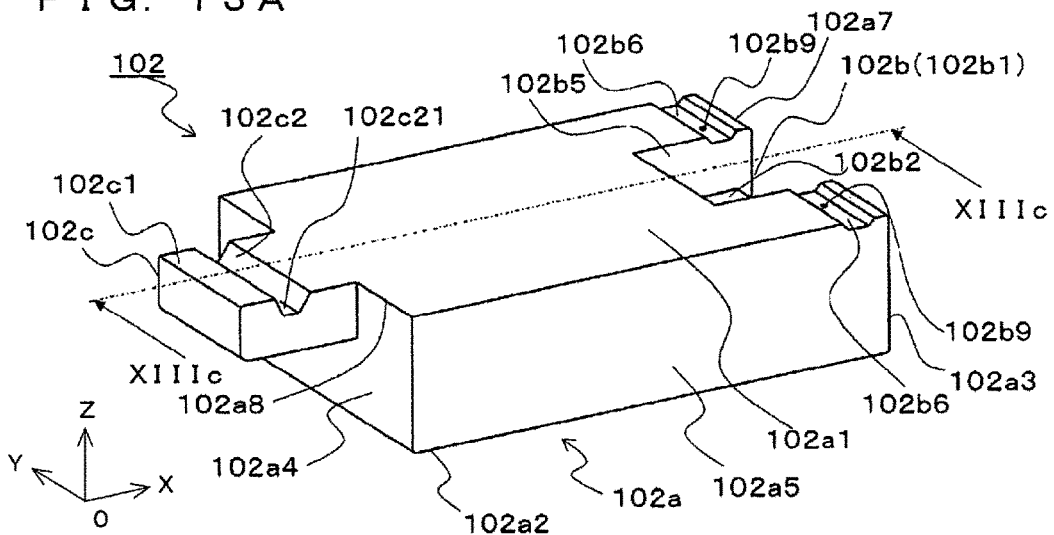
FIG. 13A illustrates a perspective view of a sub-floating body of the solar cell apparatus for use on water according to a third embodiment.
Figure 13B:
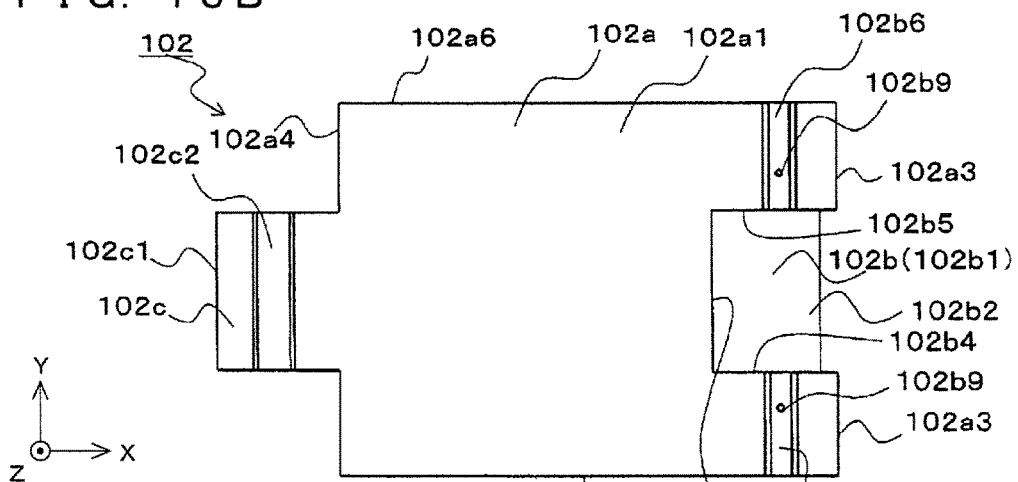
FIG. 13B illustrates a plan view of the sub-floating body shown in FIG. 13A.
Figure 13C:
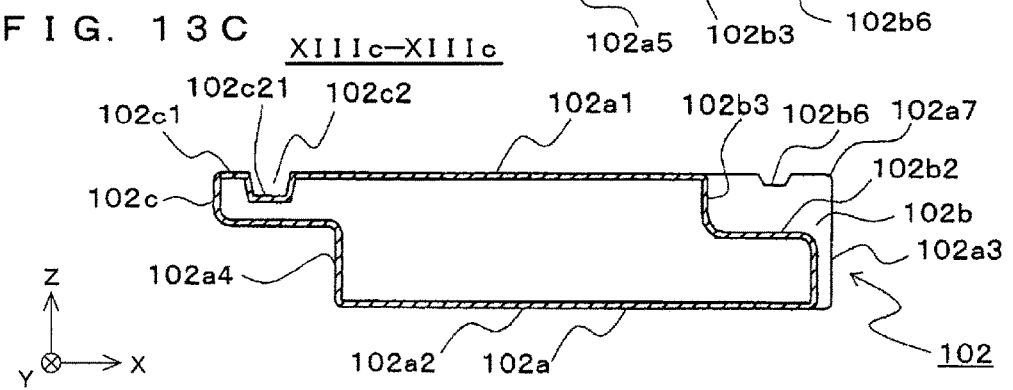
FIG. 13C illustrates a sectional view of the above-mentioned sub-floating body taken along the line XIIIc-XIIIc of FIG. 13A.

The solar cell apparatus for use on water 1 according to the second embodiment may include the solar cell module 2 having a larger size than the first surface 3a1 of the floating body 3. Specifically, the width of the solar cell module 2 in the X-axis direction may be greater than the width of the floating body 3 in the X-axis direction in the second embodiment as illustrated in FIG. 11. The solar cell module 2 is provided to overhang the third side surface 3a5 and the fourth side surface 3a6. With such configuration, an electric power generation region of the solar cell module 2 can be expanded over a gap between the third side surface 3a5 and the fourth side surface 3a6 formed when a plurality of floating bodies 3 are joined together as illustrated in FIG. 12. The amount of electric power generated by the solar cell apparatus for use on water 1 can thus be increased.

The first portions 3b1 may be cylindrical as illustrated in FIG. 11. The second portions 3b2 may also be cylindrical. This allows the floating bodies 3 to oscillate smoothly due to waves, leading to reduction of cracks of the floating bodies 3 and the spacers 4.

Embodiments in Which Floating Body and Sub-floating Body are Included

Third Embodiment

The solar cell apparatus for use on water 1 includes a plurality of sub-floating bodies 102 (a sub-first floating body 102A and a sub-second floating body 102B) joined together, and an attachment member 103 connecting the sub-floating bodies 102 together. The solar cell apparatus for use on water 1 further includes a plurality of floating bodies 3 joined to the sub-first floating body 102A and the sub-second floating body 102B, the solar cell modules 2 attached to the respective floating bodies 3, and the spacers 4.

In the third embodiment, the sub-floating bodies 102 and the attachment member 103 joining adjacent sub-floating bodies 102 together along the longitudinal direction in which the sub-floating bodies 102 are arranged end to end will be described. The float device includes a float device including, in addition to the sub-floating bodies 102 and the attachment member 103, members such as column members fixed in dents of the sub-floating bodies 102 and rigging provided between column members of adjacent sub-floating bodies 2. Configuration of the solar cell apparatus for use on water 1 is described next with reference to FIGS. 13A to 16.

<Sub-floating Body>

As illustrated in FIGS. 13A to 13C and 15A to 15C, the sub-floating body 102 includes a sub-main body part 102a in the shape of a hollow box as well as a first engagement part 102b and a second engagement part 102c provided on opposite sides of the sub-main body part 102a, for example. The sub-main body part 102a has a sub-first surface 102a1 and a sub-second surface 102a2 opposite the sub-first surface 102a1. The sub-main body part 102a also has a sub-first side surface 102a3 connecting the sub-first surface 102a1 and the sub-second surface 102a2, and a sub-second side surface 102a4 opposite the sub-first side surface 102a3. The sub-main body part 102a also has a sub-third side surface 102a5 connecting the sub-first side surface 102a3 and the sub-second side surface 102a4, and a sub-fourth side surface 102a6 opposite the sub-third side surface 102a5. In the sub-main body part 102a, the boundary (ridge) between the sub-first surface 102a1 and the sub-first side surface 102a3 is hereinafter defined as a sub-first ridge line 102a7, and the boundary (ridge) between the sub-first surface 102a1 and the sub-second side surface 102a4 is hereinafter defined as a sub-second ridge line 102a8. A direction (hereinafter, also referred to as the first direction) perpendicular to the sub-first side surface 102a3 of the sub-floating body 102 is defined as the X-axis direction, a direction (hereinafter, also referred to as the second direction) parallel to the sub-first ridge line 102a7 of the sub-floating body 102 is defined as the Y-axis direction, and a direction (hereinafter, also referred to as a third direction) orthogonal to the X-axis direction and the Y-axis direction is defined as the Z-axis direction. As described above, the direction of the Z-axis direction opposite the direction of gravity is referred to as the +Z-axis direction or the upward direction, and the direction of the Z-axis direction identical to the direction of gravity is referred to as the −Z-axis direction or the downward direction.

The sub-first surface 102a1 is a surface located above the waterline when the sub-floating body 102 is floated on the water surface P, and a surface on which operators walk when the sub-floating bodies 102 are joined together to be used as pontoons. The sub-second surface 102a2 is a surface opposite the sub-first surface 102a1, and a surface located below the waterline when the sub-floating body 102 is floated on the water surface P.

The sub-floating body 102 includes the first engagement part 102b provided on the sub-first side surface 102a3 and the second engagement part 102c provided on the sub-second side surface 102a4. The engagement parts of the sub-floating body 102 are described in detail next.

The first engagement part 102b includes a first recessed portion 102b1 in which a part of the sub-first surface 102a1 and a part of the sub-first side surface 102a3 are recessed continuously in the middle of the sub-first ridge line 102a7. The first recessed portion 102b1 has a bottom surface 102b2 having a depth in the Z-axis direction located between the sub-first surface 102a1 and the sub-second surface 102a2. The bottom surface 102b2 expands in the same direction as the sub-first surface 102a1. The first recessed portion 102b1 has a first side wall 102b3, a second side wall 102b4, and a third side wall 102b5 each connecting the bottom surface 102b2 and the sub-first surface 102a1. The first side wall 102b3 is located along a direction parallel to the sub-first side surface 102a3, the second side wall 102b4 is located along a direction parallel to the sub-third side surface 102a5, and the third side wall 102b5 is located along a direction parallel to the sub-fourth side surface 102a6. The sub-first surface 102a1 has two dents 102b6 elongated in the Y-axis direction. More specifically, one of the dents 102b6 is provided in a portion of the sub-first surface 102a1 located between the second side wall 102b4 and the sub-third side surface 102a5. The other one of the dents 102b6 is provided in a portion of the sub-first surface 102a1 located between the third side wall 102b5 and the sub-fourth side surface 102a6. Each of the dents 102b6 includes, at the bottom thereof, a female screw portion 102b9 at a position corresponding to a through-hole 103b of the attachment member 103 described later. The female screw portion 102b9 includes an insert nut fitted in a circular recessed portion of the dent 102b6. The width and the depth of each of the dents 102b6 are set so that the attachment member 103, which is described later, does not protrude when the attachment member 103 is disposed along the dents 102b6.

The second engagement part 102c includes a protruding portion 102c1 provided to protrude from the sub-second side surface 102a4 along the X-axis direction. More specifically, the protruding portion 102c1 is located on the sub-second side surface 102a4 of the sub-floating body 102 at a position corresponding to a portion opposite the first recessed portion 102b1. An upper surface of the second engagement part 102c corresponds to an expanded portion of the sub-first surface 102a1. A lower surface of the second engagement part 102c is a surface protruding from a portion of the sub-second side surface 102a4 located between the sub-first surface 102a1 and the sub-second surface 102a2. The protruding portion 102c1 of the second engagement part 102c is formed to be smaller than the first recessed portion 102b1 of the first engagement part 102b. This enables the protruding portion 102c1 to be fitted into the first recessed portion 102b1 to join the first engagement part 102b and the second engagement part 102c together. The second engagement part 102c further includes, in the sub-first surface 102a1 of the protruding portion 102c1, a groove portion 102c2 reaching opposite ends of the protruding portion 102c1 in the Y-axis direction. The groove portion 102c2 is formed along the second direction (Y-axis direction). The groove portion 102c2 is formed to be larger than the dents 102b6 and the attachment member 103, which is described later, as viewed from the first direction (X-axis direction).

The sub-floating body 102 may include, inside the sub-main body part 102a, a hollow portion isolated from outside air. The sub-floating body 102 includes the hollow portion to have buoyancy. The capacity of the hollow portion of the sub-floating body 102 is set so that the waterline is located between the sub-first surface 102a1 and the sub-second surface 102a2 when the sub-floating body 102 on which a weight at least corresponding to an average weight of adult men is put is floated on the water surface P. To increase stability of the sub-floating body 102, ballast (a weight) may be provided in a sub-second surface 102a2 side so that the center of gravity is located below the waterline when an operator is standing on the sub-floating body 102. The sub-floating body 102 is formed of polyethylene, polypropylene, fiber reinforced plastics (FRP), or the like, for example. The sub-floating body 102 can be formed of such a material by blow molding. The sub-floating body 102 formed of polyethylene has a thickness of approximately 5 mm to 20 mm, for example. The size of the sub-floating body 102 is determined in view of stability of an operator walking on the sub-floating body 102 and an allowable area of the water surface not contributing to electric power generation. The operator can usually walk more stably on the sub-floating body 102 having a larger area of the sub-first surface 102a1. An upper surface (the sub-first surface) 102a1 of the sub-floating body 102 thus may have a width (a size in the X-axis direction) of approximately 1.4 m to 1.6 m, a length (a size in the Y-axis direction) of approximately 0.8 m to 1.2 m, and a height (a size in the Z-axis direction) of approximately 0.3 m to 0.6 m.

<Attachment Member>

Figure 14:
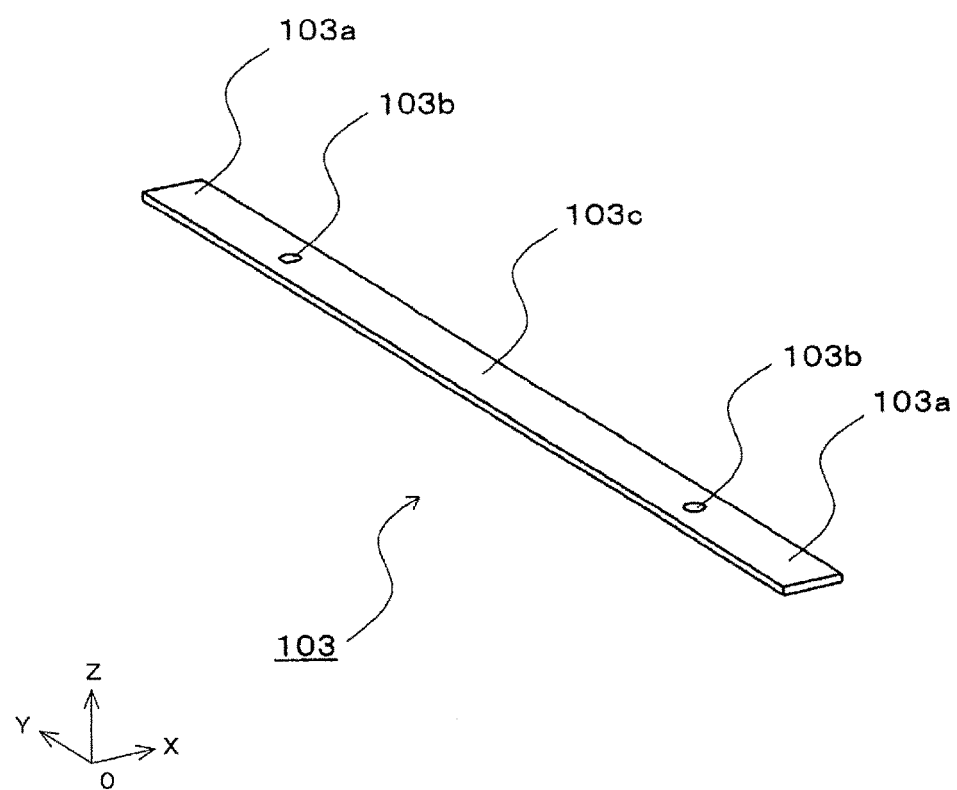
FIG. 14 illustrates a perspective view of an attachment member of the solar cell apparatus for use on water according to the third embodiment.
Figure 15A:
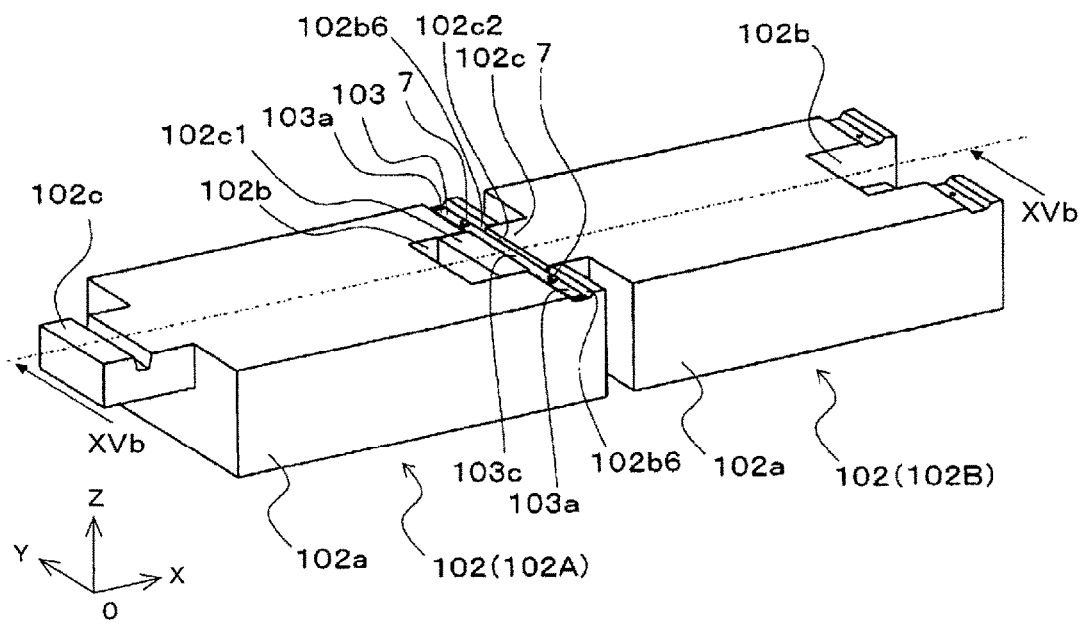
FIG. 15A illustrates a perspective view of two sub-floating bodies extracted from a plurality of sub-floating bodies joined together according to the third embodiment.
Figure 15B:
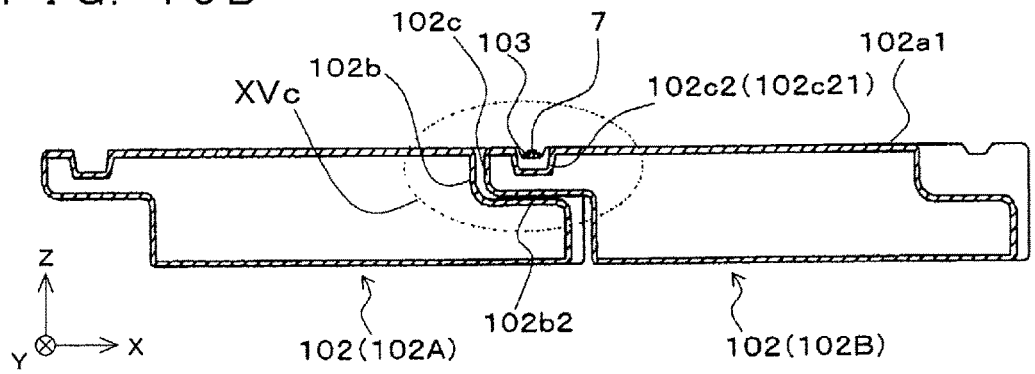
FIG. 15B illustrates a sectional view of the above-mentioned two sub-floating bodies taken along the line XVb-XVb of FIG. 15A.
Figure 15C:
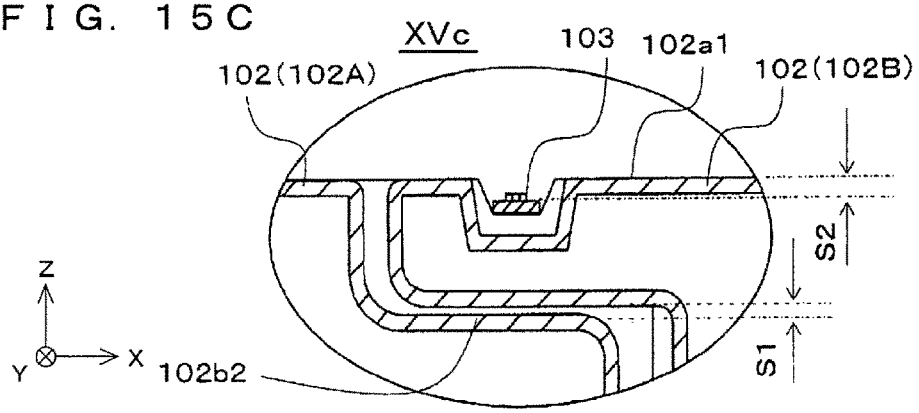
FIG. 15C illustrates an enlarged view of a cross section of a part XVc of FIG. 15B.

The attachment member 103 is a member used to join two adjacent sub-floating bodies 102 together along the longitudinal direction in which the sub-floating bodies 102 are arranged end to end as illustrated in FIGS. 14 to 15C. Specifically, the attachment member 103 is a rod-like member attached by being fitted into the dents 102b6 of one of the sub-floating bodies 102 and the groove portion 102c2 of the other one of the sub-floating bodies 102. FIG. 14 illustrates, as an example of the attachment member 103, an elongated plate-like body having through-holes 103b into which screws 7 can be inserted in opposite end portions 103a thereof.

How to join the sub-first floating body 102A and the sub-second floating body 102B together along the longitudinal direction in which the sub-first floating body 102A and the sub-second floating body 102B are arranged end to end using the attachment member 103 is described next with reference to FIGS. 13A to 15C. First, the sub-first floating body 102A and the sub-second floating body 102B are arranged with the protruding portion 102c1 of the second engagement part 102c of the sub-second floating body 102B being fitted into the first recessed portion 102b1 of the first engagement part 102b of the sub-first floating body 102A. Next, the sub-first floating body 102A and the sub-second floating body 102B are positioned so that the dents 102b6 of the sub-first floating body 102A and the groove portion 102c2 of the sub-second floating body 102B are aligned along the Y-axis direction. Next, the opposite end portions 103a of the attachment member 103 are located in the dents 102b6 of the sub-first floating body 102A, and then a middle portion 103c of the attachment member 103 is located in the groove portion 102c2 of the sub-second floating body 102B. Next, the opposite end portions 103a of the attachment member 103 are fixed to the female screw portions 102b9 of the dents 102b6 of the sub-first floating body 102A using the screws 7.

The attachment member 103 is fixed to the sub-first floating body 102A with a gap between the attachment member 103 and an inner wall 102c21 of the groove portion 102c2. This allows the sub-first floating body 102A and the sub-second floating body 102B to follow waves, walking of the operator, or the like while retaining joining thereof if the sub-first floating body 102A and the sub-second floating body 102B oscillate at different angles and the like due to the waves, walking of the operator, or the like. The sub-first floating body 102A and the sub-second floating body 102B can thus oscillate in conjunction with ruffles on the water surface P. As a result, cracks at a joint between the sub-first floating body 102A and the sub-second floating body 102B can be reduced.

The sub-first floating body 102A and the sub-second floating body 102B may be configured not to be disconnected from each other when the sub-second floating body 102B sinks more than the sub-first floating body 102A does due to the action of waves on the sub-floating bodies 102, for example. Specifically, the sub-first floating body 102A may be configured not to be disconnected from the sub-second floating body 102B and move in the first direction (X-axis direction). For example, it is assumed that the sub-first floating body 102A and the sub-second floating body 102B are joined together using the attachment member 103 as illustrated in FIG. 15C. A distance between the first engagement part 102b of the sub-first floating body 102A and the second engagement part 102c of the sub-second floating body 102B in a direction parallel to the third direction (Z-axis direction) is defined as a distance S1. A distance between the sub-first surface 102a1 of the sub-second floating body 102B and an upper surface of the attachment member 103 in the direction parallel to the third direction (Z-axis direction) is defined as a distance S2. In this case, the distance S1 may be smaller than the distance S2. This makes the sub-first floating body 102A and the sub-second floating body 102B less likely to be disconnected from each other.

The attachment member 103 can be formed of polyethylene, polypropylene, fiber reinforced plastics (FRP), or the like. The attachment member 103 may be formed of metal less prone to corrosion, such as an aluminum alloy or stainless steel, in view of rust prevention.

<Solar Cell Apparatus for Use on Water>

Figure 16:
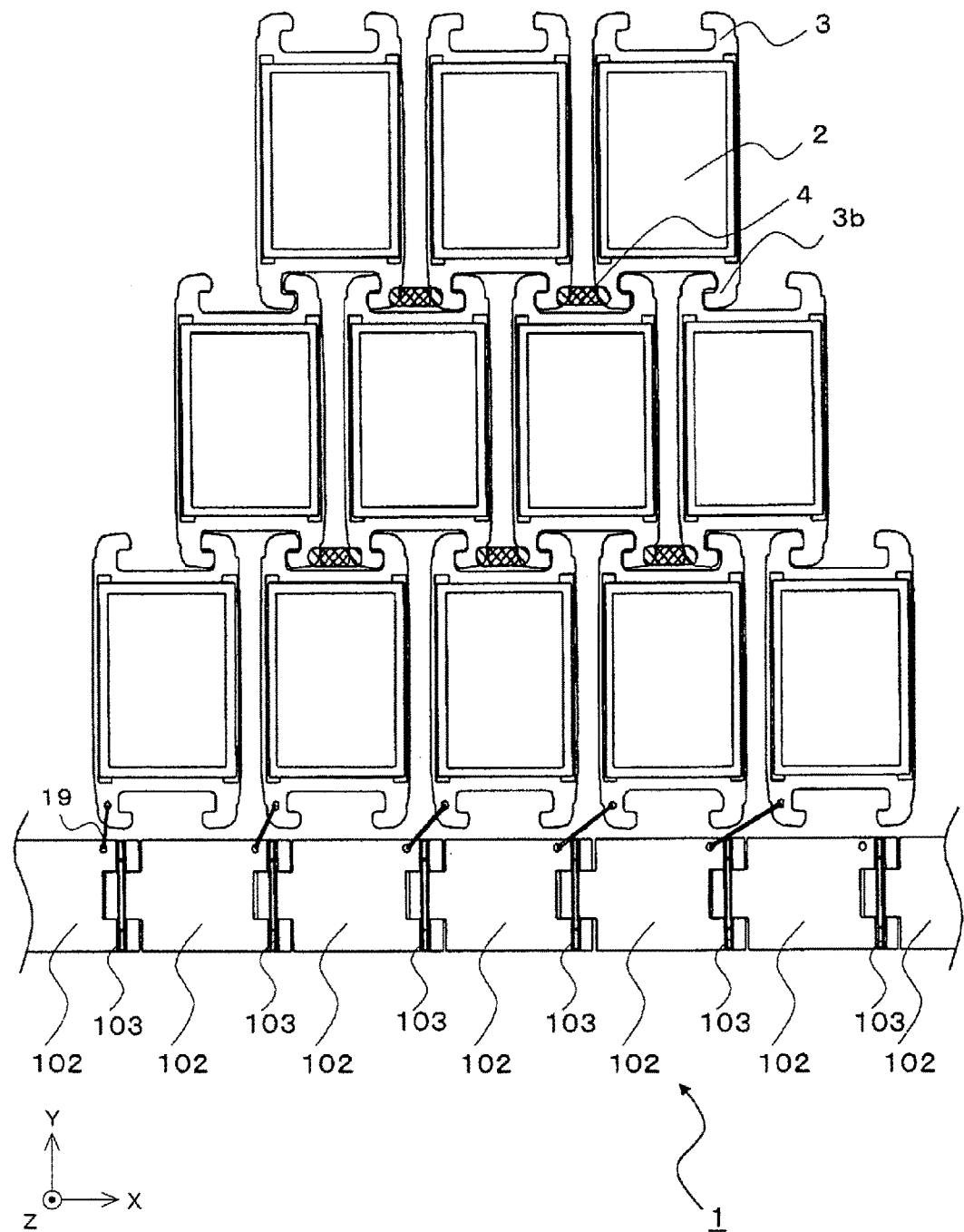
FIG. 16 illustrates a plan view of the solar cell apparatus for use on water according to the third embodiment.

As illustrated in FIG. 16, the solar cell apparatus for use on water 1 includes the sub-floating bodies 102, the attachment members 103, the floating bodies 3, the solar cell modules 2, and the spacers 4.

In the solar cell apparatus for use on water 1, the plurality of sub-floating bodies 102 and the plurality of floating bodies 3 are arranged on water. The plurality of sub-floating bodies 102 are joined together using the attachment members 103 after the second engagement part 102c of one of the sub-floating bodies 102 is fitted into the first engagement part 102b of another one of the sub-floating bodies 102.

The plurality of floating bodies 3 to which the respective solar cell modules 2 have been attached are arranged longitudinally and laterally with their joining parts 3b being connected to each other. The spacers 4 are fitted between the adjacent floating bodies 3 to determine the gaps between the floating bodies 3 and retain connection between the floating bodies 3. This makes the plurality of floating bodies 3 less likely to move excessively. The solar cell modules 2 mounted on the respective floating bodies 3 are electrically connected to one another.

A group of the plurality of sub-floating bodies 102 arranged end to end and a group of the plurality of floating bodies 3 arranged in two dimensions can be arranged to be adjacent to each other, and fixed using rigging 19 and the like, for example. This allows an operator to use the sub-floating bodies 102 of the solar cell apparatus for use on water 1 as pontoons to maintain or install the solar cell modules 2.

In the float device and the solar cell apparatus for use on water 1 according to the third embodiment of the present disclosure, the first engagement part 102b of the sub-first floating body 102A and the second engagement part 102c of the sub-second floating body 102B vertically overlap each other. With this configuration, the first engagement part 102b of the sub-first floating body 102A supports the second engagement part 102c of the sub-second floating body 102B from below. Portions of the sub-first surface 102a1 at opposite sides of the first engagement part 102b of the sub-first floating body 102A are located to sandwich the second engagement part 102c of the sub-second floating body 102B as viewed from the Z-axis direction. The attachment member 103 fixed to the sub-first surface 102a1 of the sub-first floating body 102A is inserted into the groove portion 102c2 of the sub-second floating body 102B. There is a gap between the attachment member 103 and the inner wall 102c21, so that the sub-second floating body 102B can rotate with respect to the sub-first floating body 102A in a direction of the X-Z plane within a range of the above-mentioned gap.

With this configuration, a large difference of altitude between the sub-first floating body 102A and the sub-second floating body 102B is less likely to be caused if the operator stands on the joint between the sub-first floating body 102A and the sub-second floating body 102B during moving on the sub-floating bodies 102, and thus the sub-floating bodies 102 are easily stabilized. As a result, the operator can walk on the floating bodies safely, and can easily conduct operations.

The individual sub-floating bodies 102 can independently smoothly follow waves occurring on the water surface. This can reduce a load put on a joint between the first engagement part 2b and the second engagement part 2c of the sub-floating bodies 102, leading to reduction of cracks of the floating bodies 2.

Fourth Embodiment

Figure 17A:
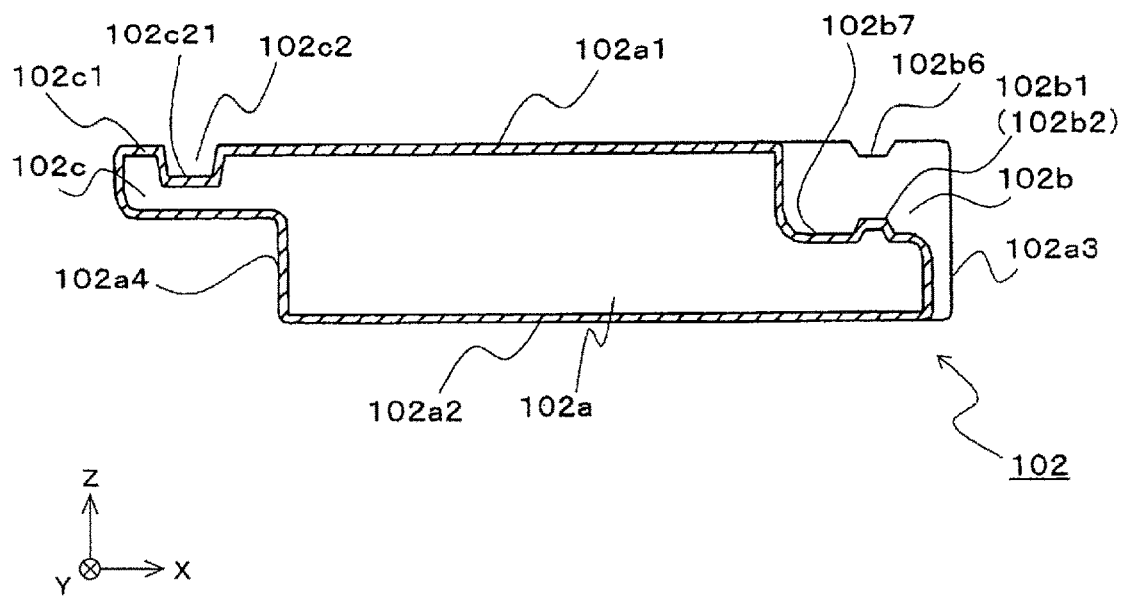
FIG. 17A illustrates a sectional view of a sub-floating body according to a fourth embodiment, and corresponds to a sectional view of the sub-floating body shown in FIG. 13C.
Figure 17B:
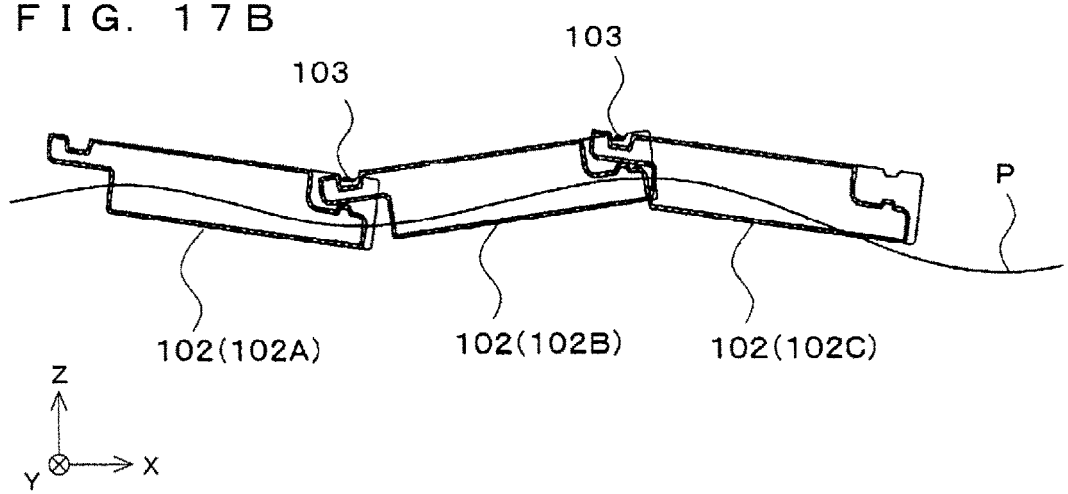
FIG. 17B illustrates a sectional view of sub-floating bodies (a first floating body, a second floating body, and a third floating body) shown in FIG. 17A joined together and floated on a water surface.

The fourth embodiment differs from the above-mentioned third embodiment in that the first engagement part 102b of the sub-floating body 102 includes second recessed portions 102b7 deeper than the first recessed portion 102b1 as illustrated in FIGS. 17A and 17B. Specifically, the first engagement part 102b includes the second recessed portions 102b7 located to sandwich the bottom surface 102b2 of the first recessed portion 102b1 in the X-axis direction and being deeper than the first recessed portion 102b1.

With this configuration, when the sub-first floating body 102A, the sub-second floating body 102B, and a sub-third floating body 102C are joined together as illustrated in FIG. 17B, the second engagement part 102c of any one of the sub-floating bodies 102 can rotate around the first recessed portion 102b1 of another one of the sub-floating bodies 102 along the X-Z plane within a greater range. In the present embodiment, if there is a large difference of altitude on the water surface P due to waves occurring on the water surface P, the individual sub-floating bodies 102 smoothly follow the waves along the water surface P, leading to reduction of a load put on the sub-floating bodies 102.

Fifth Embodiment

Figure 18:
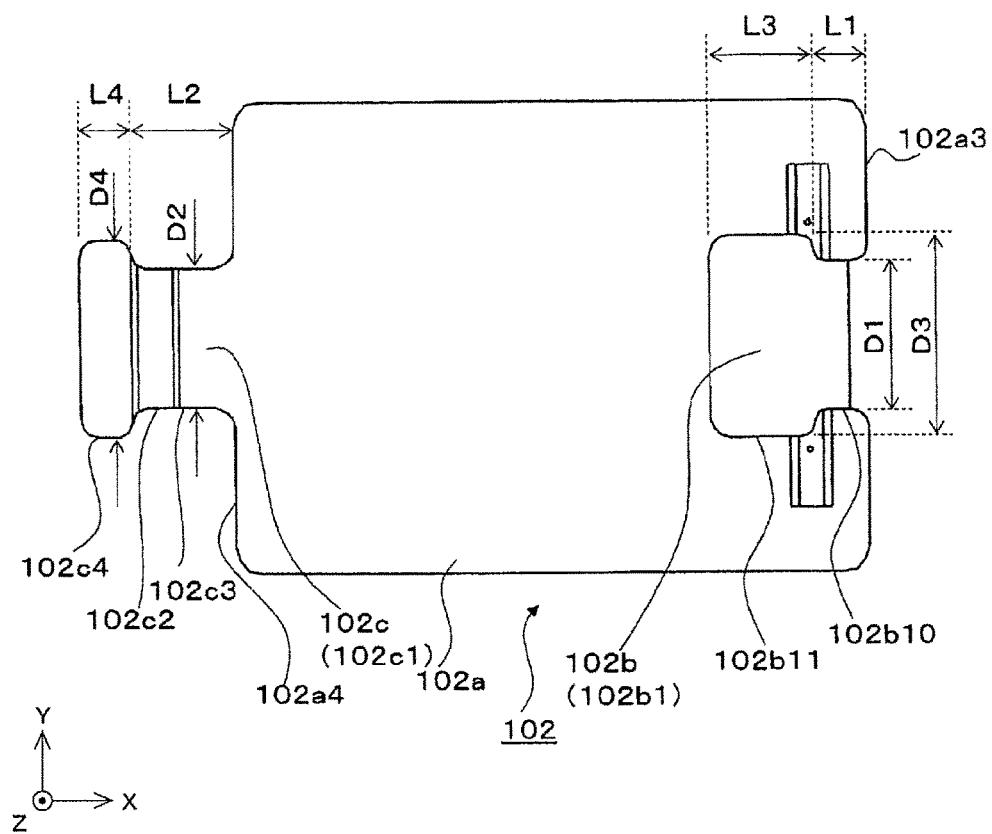
FIG. 18 illustrates a plan view of a sub-floating body according to a fifth embodiment.

The fifth embodiment differs from the above-mentioned third and fourth embodiments in configuration of the first engagement part 102b and the second engagement part 102c as illustrated in FIG. 18. In the fifth embodiment, the first recessed portion 102b1 of the first engagement part 102b includes a first narrow portion 102b10 located closer to the sub-first side surface 102a3 and a first non-narrow portion 102b11 located closer to the sub-second side surface 102a4. The second engagement part 102c includes a second narrow portion 102c3 located closer to the sub-second side surface 102a4 and a second non-narrow portion 102c4 located opposite the second narrow portion 102c3. The narrow portion herein refers to a portion having a relatively small width, and the non-narrow portion herein refers to a portion having a relatively great width. As described above, the first recessed portion 102b1 of the first engagement part 102b includes portions having different widths in the Y-axis direction in the fifth embodiment. The protruding portion 102c1 of the second engagement part 102c also includes portions having different widths in the Y-axis direction.

In the fifth embodiment, a width D1 of the first narrow portion 102b10 in the Y-axis direction (second direction) is greater than a width D2 of the second narrow portion 102c3 in the Y-axis direction as illustrated in FIG. 18. A width D3 of the first non-narrow portion 102b11 in the Y-axis direction is greater than a width D4 of the second non-narrow portion 102c4 in the Y-axis direction. With this configuration, in a case where the protruding portion 102c1 of the sub-second floating body 102B is inserted into the first recessed portion 102b1 of the sub-first floating body 102A, for example, there is a clearance in the X-axis direction and the Y-axis direction between the sub-first floating body 102A and the sub-second floating body 102B while joining of the sub-first floating body 102A and the sub-second floating body 102B is retained in the fifth embodiment. The sub-first floating body 102A and the sub-second floating body 102B thus easily follow movement of the water surface and oscillate without disconnecting the protruding portion 102c1 from the first recessed portion 102b1 if strong waves occur in the fifth embodiment. As a result, occurrence of cracks in the sub-floating bodies 102 caused by strong waves can be reduced. The first engagement part 102b and the second engagement part 102c move more smoothly when they have rounded or chamfered corners.

In the fifth embodiment, a length L1 of the first narrow portion 102b10 in the X-axis direction is smaller than a length L2 of the second narrow portion 102c3 in the X-axis direction as illustrated in FIG. 18. A length L3 of the first non-narrow portion 102b11 in the X-axis direction is greater than a length L4 of the second non-narrow portion 102c4 in the X-axis direction. With this configuration, in a case where the protruding portion 102c1 of the sub-second floating body 102B is inserted into the first recessed portion 102b1 of the sub-first floating body 102A, for example, the protruding portion 102c1 can move inside the first recessed portion 102b1 in the X-axis direction while joining of the sub-first floating body 102A and the sub-second floating body 102B is retained. This means that the sub-first floating body 102A and the sub-second floating body 102B can move in the X-axis direction within a region corresponding to the difference between the length L4 and the length L3. The sub-first floating body 102A and the sub-second floating body 102B can thus be moved in conjunction with waves within the above-mentioned region, leading to reduction of force put on the first engagement part 102b and the second engagement part 102c in the fifth embodiment.

Figure 19A:
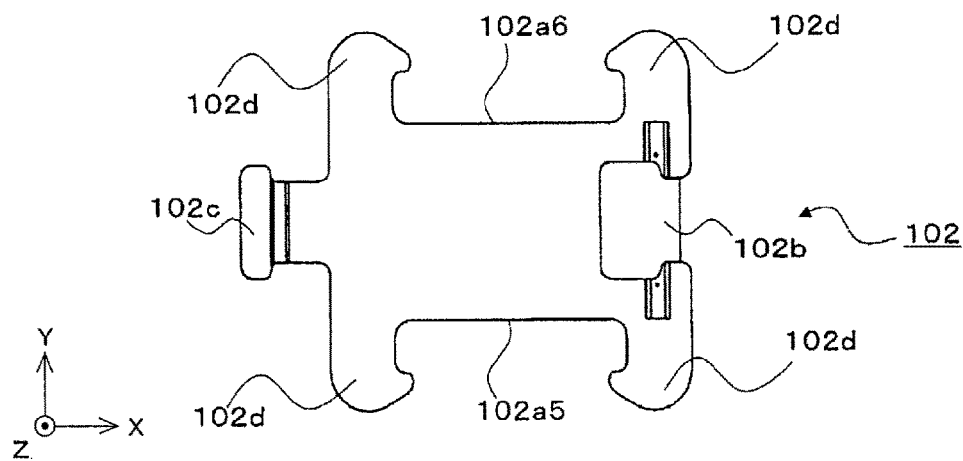
FIG. 19A a plan view of a sub-floating body according to a first modification of the fifth embodiment, and corresponds to the plan view of the sub-floating body shown in FIG. 13B.
Figure 19B:
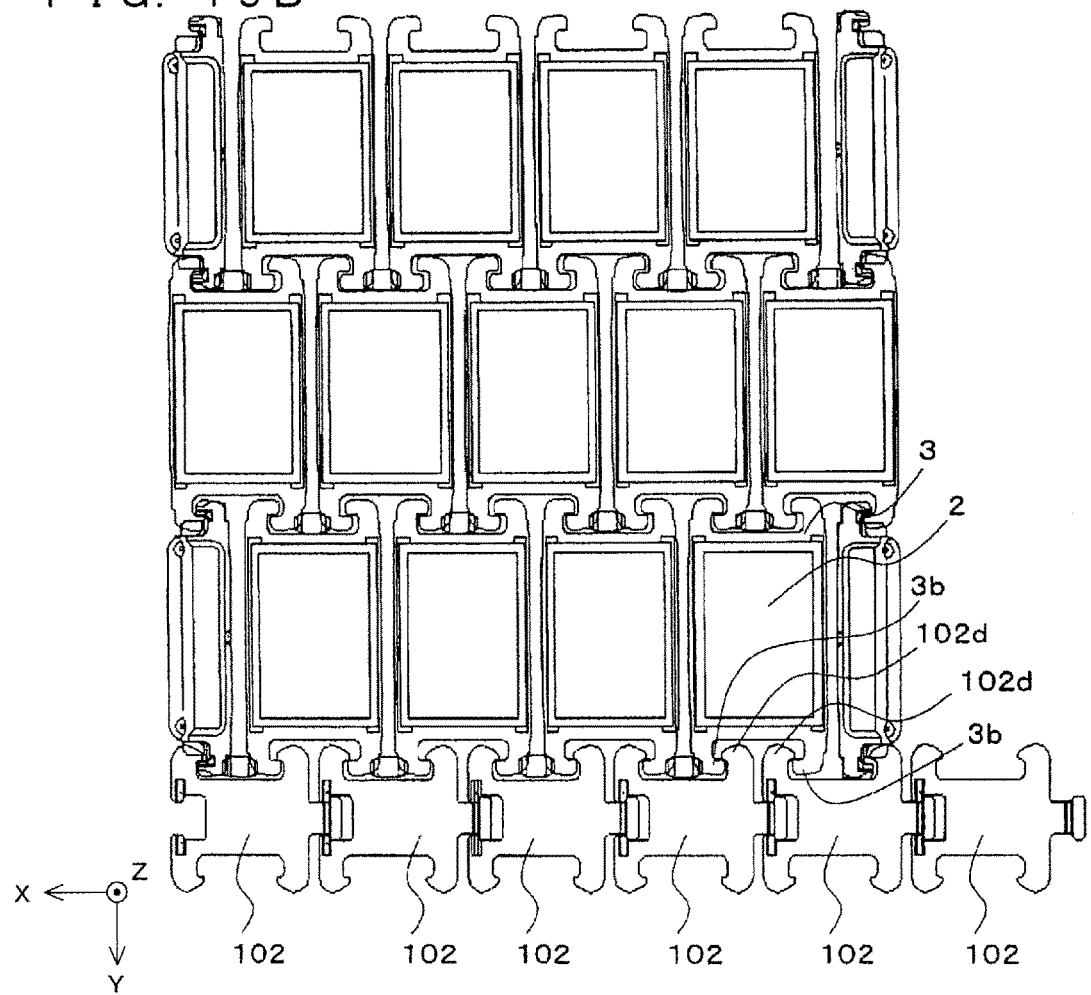
FIG. 19B illustrates a plan view of a solar cell apparatus for use on water including sub-floating bodies shown in FIG. 19A.

In the fifth embodiment, cooperation parts 102d used for connection to the floating bodies 3 may be provided on the sub-third side surface 102a5 of the sub-floating body 102 as illustrated in FIGS. 19A and 19B. As described above, the cooperation parts 102d of the sub-floating bodies 102 having similar shapes to the joining parts 3b of the floating bodies 3 facilitate joining of the floating bodies 3 and the sub-floating bodies 102, leading to improvement in operability.

The cooperation parts 102d used for connection to the floating bodies 3 may be provided also on the sub-fourth side surface 102a6.

In the fifth embodiment, the height of the sub-first surface 102a1 can be lowered at and around the positions corresponding to the dents 102b6 as illustrated in FIG. 20. The sub-floating body 102 may include a U-shaped receiving part for accommodating a cable connecting the solar cell modules 2. The sub-floating body 102 may further include a recessed portion for fixing electrical equipment, such as a power conditioner.

Sixth Embodiment

Figure 21A:
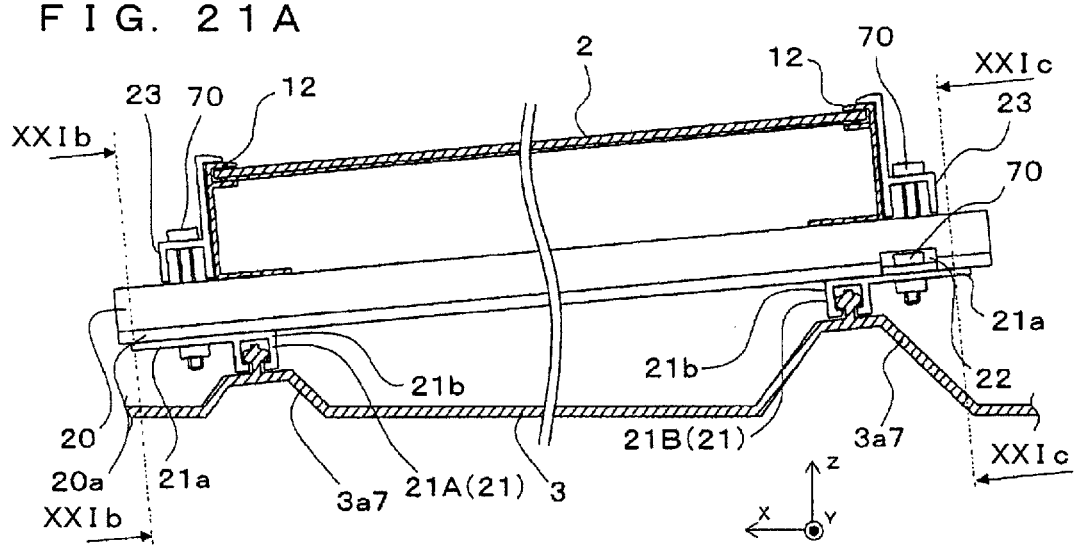
FIG. 21A illustrates a sectional view of a solar cell module and a float device of a solar cell apparatus for use on water according to a sixth embodiment taken in the X-Z plane of FIG. 1.
Figure 21B:
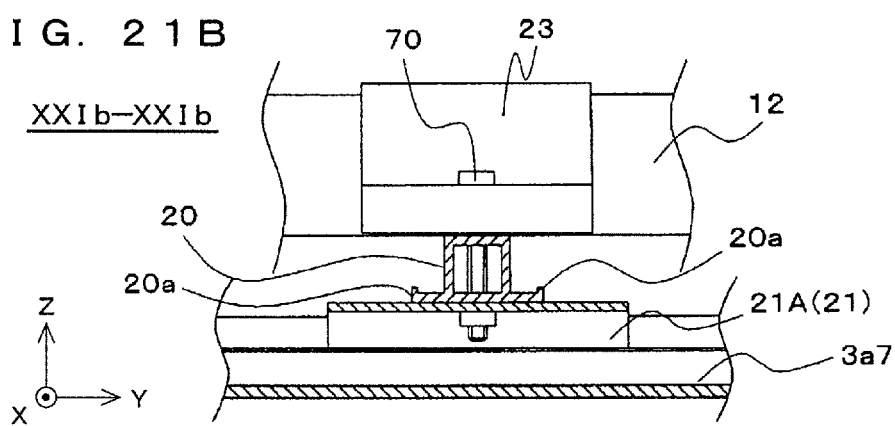
FIG. 21B illustrates a sectional view of the solar cell module and the float device taken along the line XXIb-XXIb of FIG. 21A.
Figure 21C:
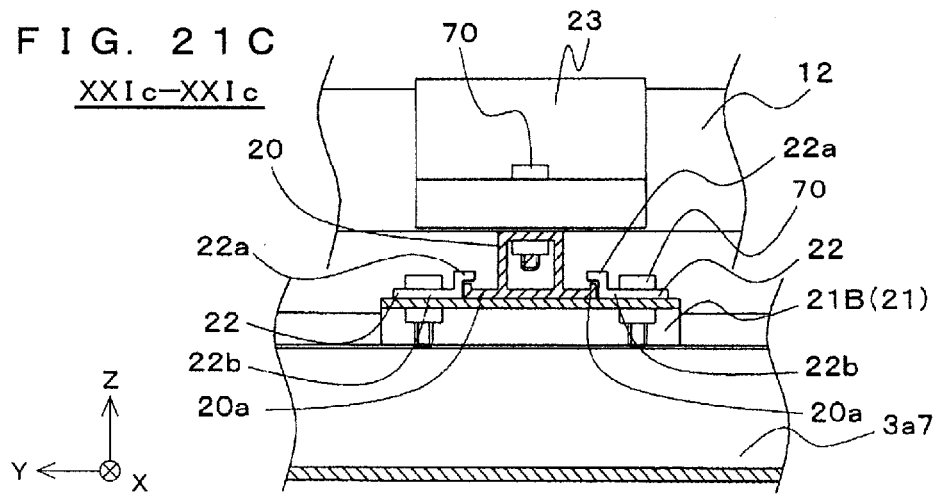
FIG. 21C illustrates a sectional view of the solar cell module and the float device taken along the line XXIc-XXIc of FIG. 21A.

The sixth embodiment differs from the above-mentioned first to fifth embodiments in that the solar cell module 2 is fixed to support members 21 attached onto the mounting parts 3a7 of the floating body 3 and a rail member 20 held on the support members 21 as illustrated in FIGS. 21A to 21C.

In sixth embodiment, the floating body 3 includes the support members 21 attached to the respective two mounting parts 3a7, the rail member 20 attached onto the support members 21, a cover member 22 holding the rail member 20 on the support member 21, and seizing members 23 fixing the solar cell module 2 onto the rail member 20.

The support members 21 are members fixed to the mounting parts 3a7 of the floating body 3 to support the rail member 20. The support members 21 each include a support surface 21a supporting the rail member 20 from below and a grasping part 21b grasping a rib provided to the mounting part 3a7 of the floating body 3. One of the support members 21 is hereinafter defined as a first support member 21A, and the other one of the support members 21 is hereinafter defined as a second support member 21B.

The rail member 20 is a square-pipe like rod member, and is an elongated member including two flange parts 20a protruding from a lower portion thereof in a direction orthogonal to the longitudinal direction thereof. The rail member 20 is mounted to span the first support member 21A and the second support member 21B. The rail member 20 is fixed at a first end portion mounted on the first support member 21A using a screw 70 penetrating the rail member 20 and the first support member 21A. The rail member 20 is held, at a second end portion mounted on the second support member 21B, by the cover member 22 pressing the flange parts 20a onto the support surface 21a of the second support member 21B.

The cover member 22 includes a hanging part 22a pressing the rail member 20 onto the support surface 21a of the second support member 21B and a mounting part 22b being in contact with the support surface 21a, and is fixed using a screw 70 penetrating the support surface 21a and the mounting part 22b.

The solar cell module 2 is fixed by being pressed by the seizing members 23 attached onto the rail member 20 using the screws 70. The cover member 22 presses the flange parts 20a in a direction of the support surface 21a using the hanging part 22a hanging the flange parts 20a of the rail member 20. There is a gap between the hanging part 22a and the flange parts 20a. In other words, the distance between the hanging part 22a and the mounting part 22b of the cover member 22 being in contact with the support surface 21a in a direction perpendicular to the support surface 21a is greater than the thickness of each of the flange parts 20a. The gap between the hanging part 22a and the flange parts 20a is approximately 1 mm, for example.

As described above, there is a gap between the hanging part 22a and the flange parts 20a, and thus the rail member 20 can move in the longitudinal direction thereof at a side held by the second support member 21B. A first end of the rail member 20 is fixed at a first support member 21A side, and a second end of the rail member 20 is supported to be movable along the longitudinal direction of the rail member 20 at a second support member 21B side. With this configuration, the solar cell module 2 can be supported while allowing deformation of the floating body 3 or the rail member 20 due to thermal expansion or thermal contraction or by external force. This can reduce dropping off of the solar cell module 2 and can reduce a load put on the solar cell module 2. Such configuration of the solar cell apparatus for use on water 1 is especially effective in a case where the floating body 3 is formed of a resin material having a high coefficient of thermal expansion.

The invention claimed is:

1. A float device comprising a floating body, wherein the floating body includes:
   a main body part having a first surface, a second surface opposite the first surface, and a first side surface connecting the first surface and the second surface; and
   a first joining part and a second joining part each located on the first side surface to be opposite to each other in a first direction parallel to a ridge line defined by the first surface and the first side surface,
   the first joining part and the second joining part each include a first portion located on the first side surface and a second portion connected to the first portion to face the first side surface,
   the second portion includes an end portion farthest from the first portion,
   an end portion of the first joining part and an end portion of the second joining part face each other, and
   a minimum distance D1 between the end portion of the first joining part and the end portion of the second joining part is greater than twice a maximum width D2 of a portion including the second portion in each of the first joining part and the second joining part in the first direction, and is smaller than a minimum distance D3 between the first portion of the first joining part and the first portion of the second joining part.

2. The float device according to claim 1, wherein the end portion at least partially has a curved surface.

3. The float device according to claim 1, wherein the floating body further includes
   a protruding part located on the first side surface to be closer to the second surface than the first joining part and the second joining part are, and
   a length of the second portion in a second direction perpendicular to the first side surface and the first direction is greater than a distance between the second portion and the protruding part in the second direction, and is smaller than a length of the first portion in the second direction.

4. The float device according to claim 3, wherein the protruding part comprises two protruding parts located outside a region between the end portion of the first joining part and the end portion of the second joining part in the first direction.

5. The float device according to claim 1, wherein
   the main body part has a second side surface opposite the first side surface and connecting the first surface and the second surface, the floating body further includes a third joining part and a fourth joining part each located on the second side surface to be opposite to each other in the first direction parallel to a ridge line defined by the first surface and the second side surface, the third joining part is located on the same axis as the second joining part in a direction parallel to a second direction perpendicular to the first direction, the fourth joining part is located on the same axis as the first joining part in a direction parallel to the second direction, and a configuration of a pair of joining parts including the third joining part and the fourth joining part on the second side surface is as same as a configuration of a pair of joining parts including the first joining part and the second joining part on the first side surface.

6. The float device according to claim 1, further comprising:

a sub-first floating body and a sub-second floating body connected to the floating body; and an attachment member joining the sub-first floating body and the sub-second floating body together along a longitudinal direction in which the sub-first floating body and the sub-second floating body are arranged end to end, wherein the sub-first floating body and the sub-second floating body each include:
a sub-main body part having a sub-first surface, a sub-second surface opposite the sub-first surface, a sub-first side surface, and a sub-second side surface opposite the sub-first side surface;
a first engagement part including a first recessed portion in which a part of the sub-first surface and a part of the sub-first side surface are recessed continuously; and
a second engagement part including a protruding portion located on the sub-second side surface at a position corresponding to a portion opposite the first recessed portion and a groove portion located in an upper surface of the protruding portion, the sub-second floating body is joined to the sub-first floating body with the protruding portion of the sub-second floating body being located above a bottom surface of the first recessed portion of the sub-first floating body, and the attachment member being located in the groove portion, and the attachment member is fixed to the sub-first floating body with a gap between the attachment member and an inner wall of the groove portion.

7. The float device according to claim 6, wherein
the first recessed portion of the first engagement part is located below the attachment member, and
the first engagement part further includes second recessed portions located to sandwich the bottom surface of the first recessed portion in the longitudinal direction, and being deeper than the first recessed portion.

8. The float device according to claim 6, wherein
the first recessed portion of the first engagement part includes a first narrow portion located closer to the sub-first side surface and a first non-narrow portion located closer to the sub-second side surface,
the protruding portion of the second engagement part includes a second narrow portion located closer to the sub-second side surface and a second non-narrow portion located opposite the second narrow portion, and
a maximum width D1 of the first narrow portion in a transverse direction orthogonal to the longitudinal direction is greater than a maximum width D2 of the second narrow portion in the transverse direction, and a maximum width D3 of the first non-narrow portion in the transverse direction is greater than a maximum width D4 of the second non-narrow portion in the transverse direction.

9. The float device according to claim 8, wherein a maximum length L1 of the first narrow portion in the longitudinal direction is smaller than a maximum length L2 of the second narrow portion in the longitudinal direction, and a maximum length L3 of the first non-narrow portion in the longitudinal direction is greater than a maximum length L4 of the second non-narrow portion in the longitudinal direction.

10. A solar cell apparatus for use on water comprising:
a plurality of float devices arranged and joined together, and including floating bodies; and
solar cell modules located on the float devices, wherein the floating bodies each include:
a main body part having a first surface on which a corresponding one of the solar cell modules is located, a second surface opposite the first surface, and a first side surface connecting the first surface and the second surface; and
a first joining part and a second joining part each located on the first side surface to be opposite to each other in a first direction parallel to a ridge line defined by the first surface and the first side surface,
the first joining part and the second joining part each include a first portion located on the first side surface and a second portion connected to the first portion to face the first side surface,
the second portion includes an end portion farthest from the first portion,
an end portion of the first joining part and an end portion of the second joining part face each other, and
a minimum distance D1 between the end portion of the first joining part and the end portion of the second joining part is greater than twice a maximum width D2 of a portion including the second portion in each of the first joining part and the second joining part in the first direction, and is smaller than a minimum distance D3 between the first portion of the first joining part and the first portion of the second joining part.

11. The solar cell apparatus for use on water according to claim 10, wherein
the floating bodies include a first floating body and a second floating body arranged in the first direction, and
the solar cell apparatus for use on water further comprises a spacer located between the first joining part of the first floating body and the second joining part of the second floating body.

12. The solar cell apparatus for use on water according to claim 11, wherein the spacer includes:
a shank part located between the first joining part of the first floating body and the second joining part of the second floating body;
a first protruding part located on an upper portion of the shank part to overlap an upper surface of the first joining part of the first floating body and an upper surface of the second joining part of the second floating body; and
a second protruding part located on a lower portion of the shank part to overlap a lower surface of the first joining part of the first floating body and a lower surface of the second joining part of the second floating body, and a lower surface of the first protruding part slopes upwards with respect to an axial direction of the shank part.

13. A float device comprising a plurality of floating bodies, wherein the floating bodies each include:
- a main body part having a first surface, a second surface opposite the first surface, and a first side surface connecting the first surface and the second surface; and
- a first joining part and a second joining part each located on the first side surface to be opposite to each other in a first direction parallel to a ridge line defined by the first surface and the first side surface, the first joining part and the second joining part each include a first portion located on the first side surface and a second portion connected to the first portion to face the first side surface, the second portion includes an end portion farthest from the first portion, an end portion of the first joining part and an end portion of the second joining part face each other, and a minimum distance D1 between the end portion of the first joining part and the end portion of the second joining part is greater than twice a maximum width D2 of a portion including the second portion in each of the first joining part and the second joining part in the first direction, and is smaller than a minimum distance D3 between the first portion of the first joining part and the first portion of the second joining part.

14. The float device according to claim 13, wherein the main body part has a second side surface opposite the first side surface and connecting the first surface and the second surface, each of the plurality of floating bodies further includes a third joining part and a fourth joining part each located on the second side surface to be opposite to each other in the first direction parallel to a ridge line defined by the first surface and the second side surface, in each of the plurality of floating bodies, the third joining part is located on the same axis as the second joining part in a direction parallel to a second direction perpendicular to the first direction, the fourth joining part is located on the same axis as the first joining part in a direction parallel to the second direction, and a configuration of a pair of joining parts including the third joining part and the fourth joining part on the second side surface is as same as a configuration of a pair of joining parts including the first joining part and the second joining part on the first side surface.

* * * * *